(12) United States Patent
Kinoshita et al.

(10) Patent No.: US 7,838,379 B2
(45) Date of Patent: Nov. 23, 2010

(54) NON-VOLATILE MEMORY DEVICE AND METHOD OF MANUFACTURING THE SAME

(75) Inventors: Masaharu Kinoshita, Kokubunji (JP); Motoyasu Terao, Hinode (JP); Hideyuki Matsuoka, Nishitokyo (JP); Yoshitaka Sasago, Tachikawa (JP); Yoshinobu Kimura, Tokyo (JP); Akio Shima, Hino (JP); Mitsuharu Tai, Kokubunji (JP); Norikatsu Takaura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/362,277

(22) Filed: Jan. 29, 2009

(65) Prior Publication Data

US 2009/0189137 A1 Jul. 30, 2009

(30) Foreign Application Priority Data

Jan. 29, 2008 (JP) ............................. 2008-017013

(51) Int. Cl.
*H01L 21/20* (2006.01)
(52) U.S. Cl. ..................... 438/381; 438/238; 438/680; 438/692; 257/E21.17; 257/E21.006; 257/E21.053; 257/E21.058; 257/E21.134; 257/E21.304; 257/E21.229; 257/E21.245; 257/E21.347; 257/E21.352; 257/E21.645; 257/E21.646
(58) Field of Classification Search ............... 438/238, 438/381, 91, 95, 96, 97, 57, 487, 353, 680, 438/682, 683, 684, 685, 686, 687, 688, 706, 438/692, 753; 257/E21.006, 17, 53, 58, 134, 257/229, 245, 347, 352, 645, 646
See application file for complete search history.

(56) References Cited

U.S. PATENT DOCUMENTS

| | | | | | |
|---|---|---|---|---|---|
| 5,166,758 | A | * | 11/1992 | Ovshinsky et al. | 257/3 |
| 5,296,716 | A | * | 3/1994 | Ovshinsky et al. | 257/3 |
| 6,087,674 | A | * | 7/2000 | Ovshinsky et al. | 257/2 |
| 6,750,469 | B2 | | 6/2004 | Ichihara et al. | |
| 2003/0186481 | A1 | * | 10/2003 | Lung | 438/95 |

OTHER PUBLICATIONS

Mutsuko Hatano et al., "Excimer laser-induced temperature field in melting and resolidification of silicon thin films", Journal of Applied Physics., vol. 87, No. 1, Jan. 2000, pp. 36-43.
Chang-Ho Oh et al., "A Novel Phase-Modulated Excimer-Laser Crystallization Method of Silicon Thin Films", Japanese Journal of Applied Physics, vol. 37, May 1998, pp. L492-L495.

* cited by examiner

*Primary Examiner*—David Nhu
(74) *Attorney, Agent, or Firm*—Miles & Stockbridge P.C.

(57) ABSTRACT

In a phase change memory, electric property of a diode used as a selection device is extremely important. However, since crystal grain boundaries are present in the film of a diode using polysilicon, it involves a problem that the off leak property varies greatly making it difficult to prevent erroneous reading. For overcoming the problem, the present invention provides a method of controlling the temperature profile of an amorphous silicon in the laser annealing for crystallizing and activating the amorphous silicon thereby controlling the crystal grain boundaries. According to the invention, variation in the electric property of the diode can be decreased and the yield of the phase-change memory can be improved.

9 Claims, 28 Drawing Sheets

NON-VOLATILE MEMORY DEVICE AND METHOD OF MANUFACTURING THE SAME

CLAIM OF PRIORITY

The present application claims priority from Japanese patent application JP 2008-017013 filed on Jan. 29, 2008, the content of which is hereby incorporated by reference into this application.

BACKGROUND OF THE INVENTION

1. Field of the Invention

The present invention relates to a method of manufacturing an electrically rewritable phase change memory device for non-volatile memory storage of a resistance value determined by the phase change of a metal compound between a crystalline state and an amorphous state.

2. Description of the Related Arts

Non-volatile memory devices include those using a crystalline state and an amorphous state of a metal compound as memory information. As the memory material, tellurium compounds are generally used. The principle of storing information due to the difference of the reflectance thereof has been used generally in optical information memory media such as DVD (Digital Versatile Disk).

In recent years, it has been proposed to utilize the principle also for electric information storage. Different from the optical method, this is a method of detecting the difference of an electric resistance between amorphous and crystal, that is, a high resistance state of the amorphous and a low resistance state of the crystal, by the amount of current or the change of voltage. This is known as a phase change (type) memory and known technical documents include, for example, Patent Document 1 (U.S. Pat. No. 6,750,469). The present invention concerns the electrical information storage.

A basic structure of a memory cell of a phase change memory has a structure of a combination of a phase change resistance device and a selection device. The phase change memory stores and possesses information by forming a non-volatile recording material layer to a crystalline state or an amorphous state by a Joule heat generated by applying a current from a selection device to a phase change resistance device. Rewriting of the information may be attained by applying a high current to elevate the temperature of the resistance change material to a melting point or higher and then rapidly cooling the same, in a case where an amorphous state having electrically high resistance is formed. A crystalline state having an electrically low resistance may be attained by restricting the current to be applied so as to reach a crystallization temperature which is lower than the melting point. Generally, a resistance value of a no-volatile recording material layers changes from 2 to 3 digits by the phase change. Accordingly, in the phase change memory, a reading signal is different greatly depending on whether the state is crystalline or amorphous to facilitate the sensing operation.

SUMMARY OF THE INVENTION

In a case where a diode is used as the selection device in the phase change memory, an electric property of the diode is extremely important. For example, as shown in FIG. 39, when reading from a memory cell MCa is conducted, a voltage Vr is applied to a word line WLa and a voltage V0 is applied to a word line WLb respectively, and a current flowing in a bit line BLa is detected by a sensor amplifier SA. In this case, it is necessary to attain a low off leak in a selection device SE so that a current does not flow between the word line WLb and the bit line BLa in a memory cell MCb connected with the bit line BLa. However, in a diode using polysilicon, since a number of crystal grain boundaries are present in a film, the off leak property varies greatly and it is difficult to prevent erroneous reading. Accordingly, for manufacturing a phase change memory at a good yield, control for the crystal grain boundaries of polysilicon is necessary. In existent techniques, for example, in J. Appl. Phys., 87, 2000, pp. 36 to 43, Excimer Laser-induced Temperature Field in Melting and Resolidification of Silicon Thin Films, a relation between the irradiation method of an excimer laser and the crystalline state of polysilicon is studied in details. Further, Jpn. J. Appl. Phys., 37, 1998, pp. L492 to L495, A Novel Phase-Modulated Excimer-Laser Crystallization Method of Silicon Thin Films discloses a relation between laser irradiation and crystal grain boundaries. However, these documents intend the improvement of the property of TFT in which a current flows laterally but they do not show the improvement of the property of a selection device in which a current flows in the vertical direction as in the present invention.

The present invention intends to provide a phase change memory at high yield with less variation in the electric property of a diode which is the selection device by eliminating crystal grain boundaries in polysilicon during a manufacturing process.

For attaining the purpose described above, the invention provides a method of controlling the temperature profile of silicon thereby controlling crystal grain boundaries in laser annealing for crystallization and activation of amorphous silicon. FIG. 1A shows an intensity (P) of a laser power relative to a position (x) in a specimen in which amorphous silicon is formed on a surface. FIGS. 1A to 1C show that the intensity of the laser power is constant relative to the position of the specimen in the horizontal direction. FIG. 1B shows a temperature profile in a specimen cross section relative to the position (x) in the specimen. In the drawing, 001 denotes an amorphous silicon layer formed on the surface of a specimen, and an arrow in the drawing shows the preceding direction of laser scanning. When crystallization and activation are performed at a constant laser power as shown in FIG. 1A, the temperature profile of the specimen just after the laser irradiation is uniform relative to the position (x) in the specimen as shown in FIG. 1B. Axis z in the drawing shows the direction of depth of the amorphous silicon layer 001 and the relation of temperature just after the laser irradiation is: TMP1>TMP2>TMP3>TMP4. In the polysilicon layer 002 obtained by crystallizing the amorphous silicon layer 001, crystal grain boundaries GB are present at random with no control as shown in FIG. 1C when viewed from the upper surface of the specimen. Axis y shows the direction perpendicular to the axis x within a horizontal plane on the specimen surface.

In a first method of the invention, the laser power is constant as shown in FIG. 2A. When a light reflection layer MASK is provided above the amorphous silicon layer 001 which is the specimen as shown in FIG. 2B, the laser is absorbed to or reflected at the light reflection layer MASK, thereby providing a temperature profile which differs depending on the position (x) in the specimen. Since the temperature below the light reflection layer MASK is lowered and the portion is cooled precedingly, crystallization occurs from the portion below the light reflection layer MASK. As a result, when viewing the specimen from above the upper surface, crystal grain boundaries GB of the obtained polysilicon can be controlled so that they are generated on the outside of the light reflection layer MASK as shown in FIG. 2C. As will be described later specifically for an embodiment to be described later, since a diode which is a selection device is formed at a portion below the light reflection layer MASK, variation of the electric property of the diode is decreased and the yield of the phase change memory can be improved.

Further, in a second method of the invention, as shown in FIG. 3A, the laser power is modulated relatively lower in a region PTN where a selection device is formed, thereby providing a temperature profile which is different depending on the position (x) in the specimen as shown in FIG. 3B. Since the temperature below the region PTN where a selection device is formed is lowered and the portion is cooled precedingly, crystallization occurs from the portion below the region PTN. As a result, when viewing the specimen from above the upper surface, crystal grain boundaries GB of the obtained polysilicon layer 002 can be controlled such that they are generated on the outside of the region PTN in which the selection device is formed as shown in FIG. 3C. Like the first method that has been explained with reference to FIG. 2A to FIG. 2C, variation of the electric property of the diode is decreased and the yield of the phase change memory can be improved. In the second method, since it is not necessary to additionally provide a light reflection layer, the number of manufacturing steps is not increased.

According to the invention, since a memory matrix can be constituted while avoiding the effect of the crystal grain boundaries in the diode layer, a non-volatile memory can be manufactured at a good yield.

DETAILED DESCRIPTION OF THE PREFERRED EMBODIMENTS

Figure 1A:
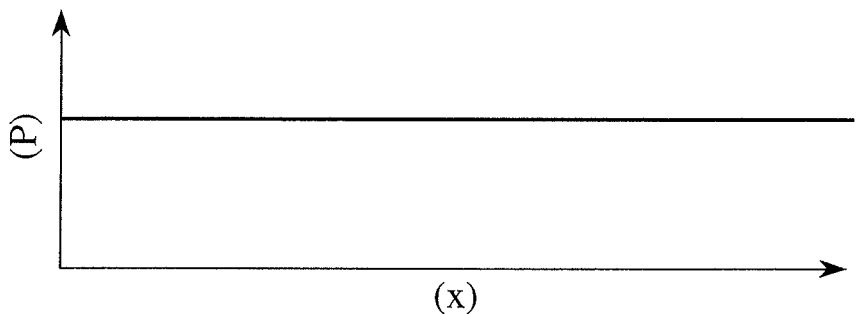
FIGS. 1A, 1B, and 1C are views showing the laser irradiation position of a specimen, a laser intensity, a temperature profile, and a crystal state.
Figure 1B:
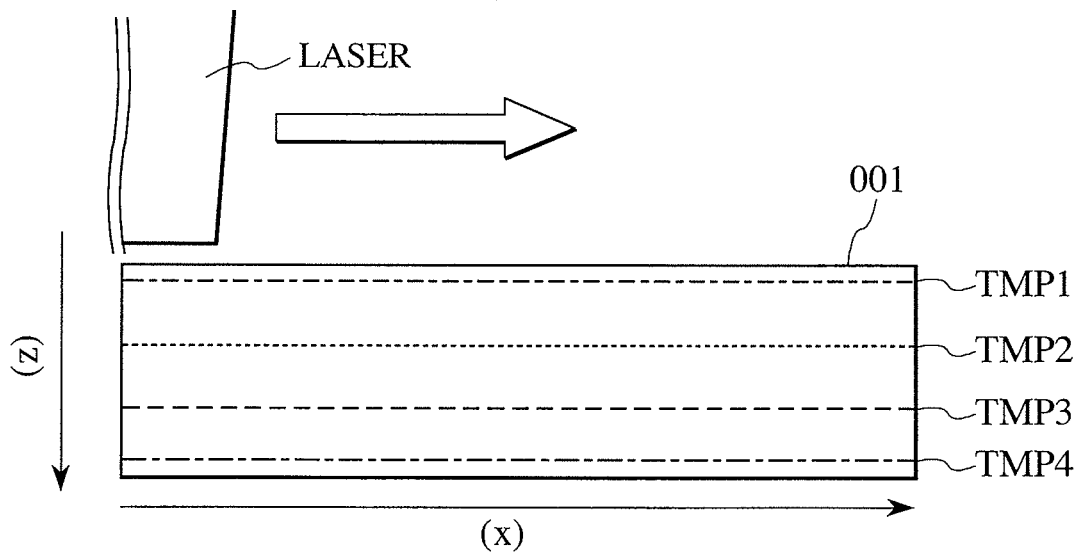
Figure 1C:
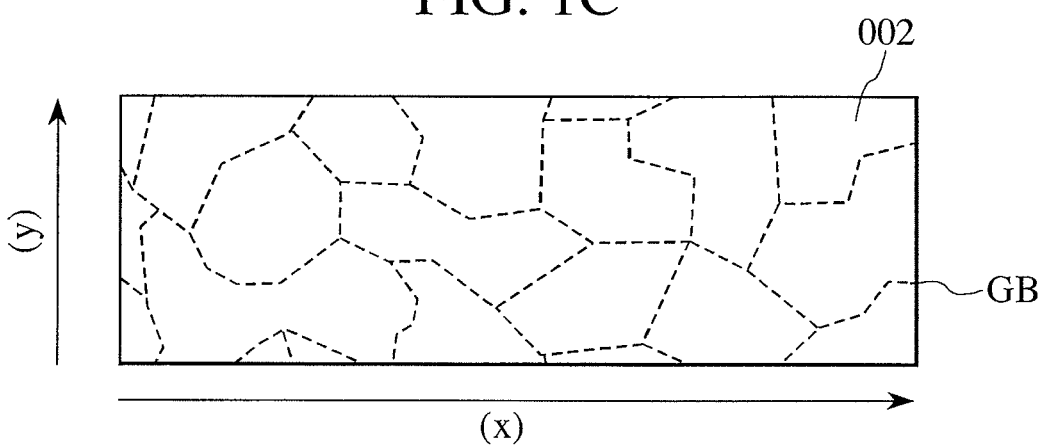

The present invention is to be described specifically by way of preferred embodiments with reference to the drawings. Throughout the drawings for explaining the preferred embodiments, identical components carry identical reference numerals, in principle, and duplicate descriptions thereof are omitted. Further, in the following embodiments, descriptions for identical or similar portions are not generally repeated unless they are required.

Further, in the drawing used for the embodiments, hatching may sometimes be not applied even in a case of cross sectional views for easy understanding of the drawings. Further, hatching may sometimes be applied even for plan views for easy understanding of the drawings.

Embodiment 1

Figure 4A:
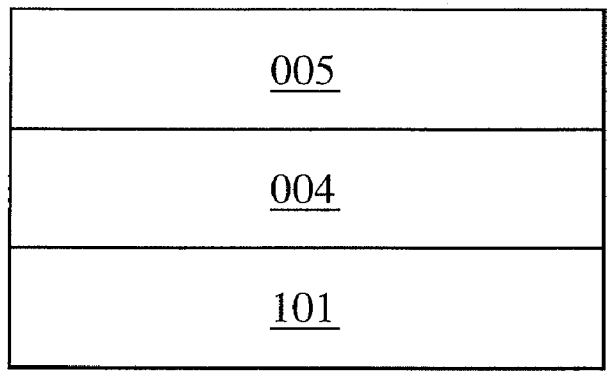
FIGS. 4A, 4B, and 4C are views each showing a positional relation of a silicon substrate, a peripheral circuit portion, and a memory matrix portion.
Figure 4B:
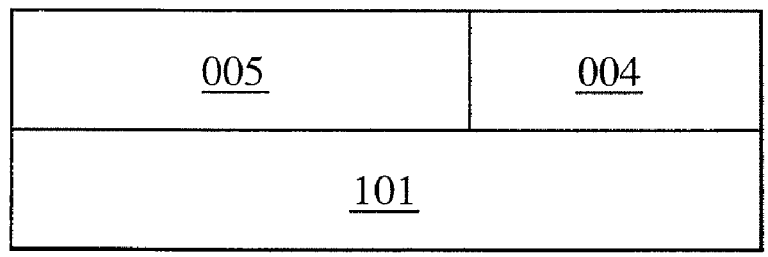
Figure 4C:
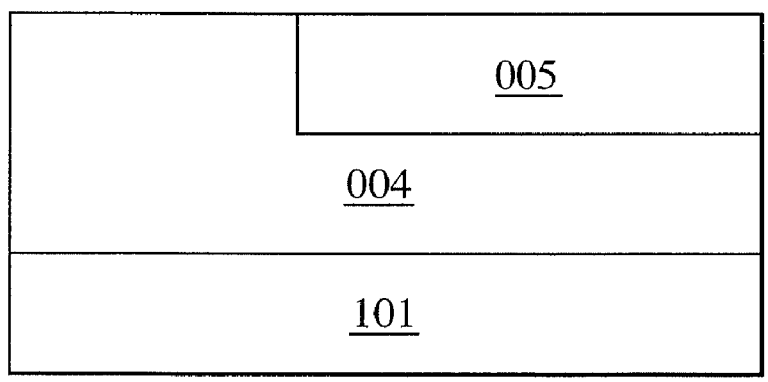
Figure 5:
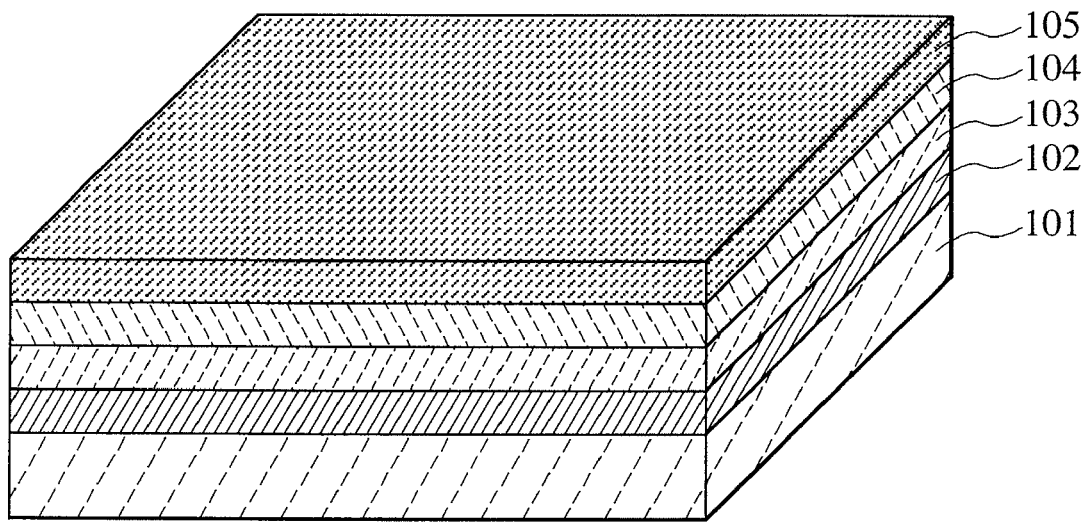
FIG. 5 is a perspective view of a semiconductor device according to Embodiment 1 of the invention during a manufacturing step.

In this embodiment, a semiconductor device of the invention is formed above a semiconductor substrate 101 shown in FIG. 5. The semiconductor substrate 101 has a peripheral circuit portion 004 for operating a memory matrix of a non-volatile memory. The peripheral circuit is manufactured by using an existent CMOS technique. FIG. 4A to FIG. 4C show a positional relationship between a memory matrix portion 005 and the peripheral circuit portion 004 in the cross section of the semiconductor substrate (silicon substrate). In this embodiment, description is to be made with an example of manufacturing the memory matrix portion 005 above the peripheral circuit portion 004 as shown in FIG. 4A, but the positional relation between the memory matrix portion 005 and the peripheral circuit portion 004 may be such that the memory matrix portion 005 and the peripheral circuit portion 004 are in an identical layer as shown in FIG. 4B, or the memory matrix portion 005 and the peripheral circuit portion 004 are in an identical layer, and the peripheral circuit portion 004 may be present also in a layer below the memory matrix portion.

FIG. 5 shows a structure of depositing a first metal interconnect layer 102, a first amorphous silicon layer 103, a second amorphous silicon layer 104, and a light reflection layer 105 successively above a semiconductor substrate 101 (including the peripheral circuit portion 004 and the silicon substrate 003 in FIG. 4A). The first metal interconnect layer 102 is formed by sputtering. The material of the first metal interconnect layer 102 is tungsten. Since a material of lower resistivity shows less voltage drop and can effectively obtain a read current, aluminum or copper of lower resistivity than tungsten is more preferred as a material. Further, a metal compound such as TiN may be deposited between the first metal interconnect layer 102 and the semiconductor substrate 101 for improving adhesion. Further, tungsten silicide or titanium silicide may also be formed between the first amorphous silicon layer 103 and the first metal interconnect layer 102 for lowering the boundary resistance by using a known silicide technique. In the same manner, tungsten silicide or titanium silicide may be formed also between the second amorphous silicon layer 104 and the light reflection layer 105 for lowering the boundary resistance by using a known silicide technique.

The first amorphous silicon layer 103 is formed of amorphous silicon containing boron, gallium, or indium, and the second amorphous silicon layer 104 is formed of intrinsic amorphous silicon. In a case where the first metal interconnect layer 102 is formed of tungsten, boron-containing amorphous silicon is preferred than gallium- or indium-containing amorphous silicon for forming the first amorphous silicon layer 103, since the boundary resistance between the first amorphous silicon layer 103 and the first metal interconnect layer 102 is lowered. The first amorphous silicon layer 103 and the second amorphous silicon layer 104 are formed by LP-CVD (Low Pressure Chemical Vapor Deposition). The first amorphous silicon layer 103 has a thickness of 10 nm or more and 250 nm or less, and the second amorphous silicon layer 104 has a thickness of 10 nm or more and 250 nm or less. Then, by ion-implanting phosphor to the second amorphous silicon layer 104, an $n^+$ type semiconductor region is formed.

While the ion to be implanted is phosphor herein, it may also be arsenic. Further, the second amorphous silicon layer 104 may be formed previously as amorphous silicon containing phosphor or arsenic thereby saving the number of processing steps.

As the material of the light reflection layer 105, W, Mo, etc. are preferred in the case of metals, TiN, AlN, etc. are preferred in the case of conductive nitrides, and SnO, ZnO, etc. are preferred in the case of conductive oxides. While the metals are preferred since they do not increase the driving voltage of the phase change memory because the resistivity of the light reflection layer is lowered and the voltage drop in the light reflection layer is decreased, the metals involve a problem that they react with silicon which is heated to a high temperature upon laser annealing to deteriorate the reliability of the diode property. Such situations are reversed in a case of the conductive nitrides or the conductive oxides.

The thickness of the light reflection layer 105 is such that the phase is inverted between a light transmitting through the reflection layer and a light transmitting through the reflection layer under reciprocation inside the layer to weaken each other. Assuming the wavelength of a laser used for laser annealing as λ, and a refractive index of the reflection layer to the wavelength as n, the layer thickness is preferably λ/2n. The layer thickness is 20 nm or more and 300 nm or less while it is different depending on the wavelength of the laser and the refractive index of the reflection layer. It is more preferably 50 nm or more and 250 nm or less. In a case where the layer thickness is excessively thin, the anti-reflection effect is decreased and, on the other hand, where it is excessively thick, the driving voltage is increased.

Figure 6:
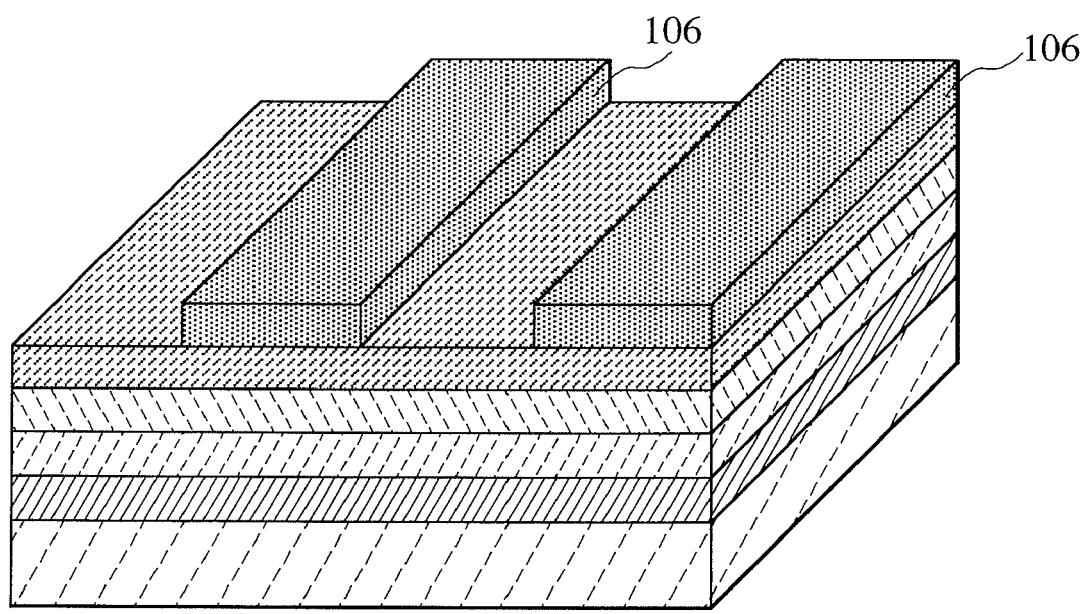
FIG. 6 is a perspective view during a manufacturing step of the semiconductor device succeeding to FIG. 5.

FIG. 6 shows a structure after patterning a resist by using a known lithographic technique above the structure shown in FIG. 5. The pattern of the resist 106 is the pattern for the word line and formed so as to extend in parallel with an adjacent pattern above the memory matrix as far as connection portion with the periphery circuit.

Figure 7:
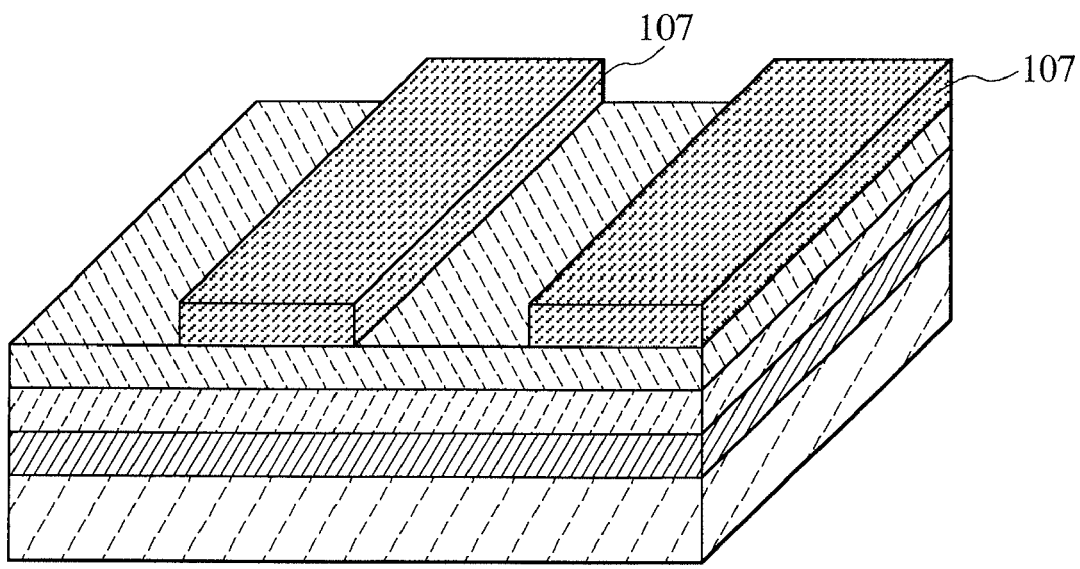
FIG. 7 is a perspective view during a manufacturing step of the semiconductor device succeeding to FIG. 6.

FIG. 7 shows a structure after etching the light reflection layer 105 by a known dry etching technique using the resist 106 shown in FIG. 6 as a mask and removing the resist 106 by using a known technique.

Figure 2A:
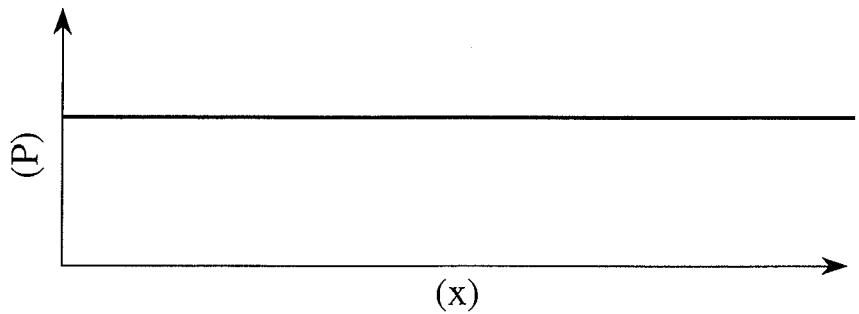
FIGS. 2A, 2B, and 2C are views showing a laser irradiation position of a specimen, a laser intensity, a temperature profile, and a crystal state.
Figure 2B:
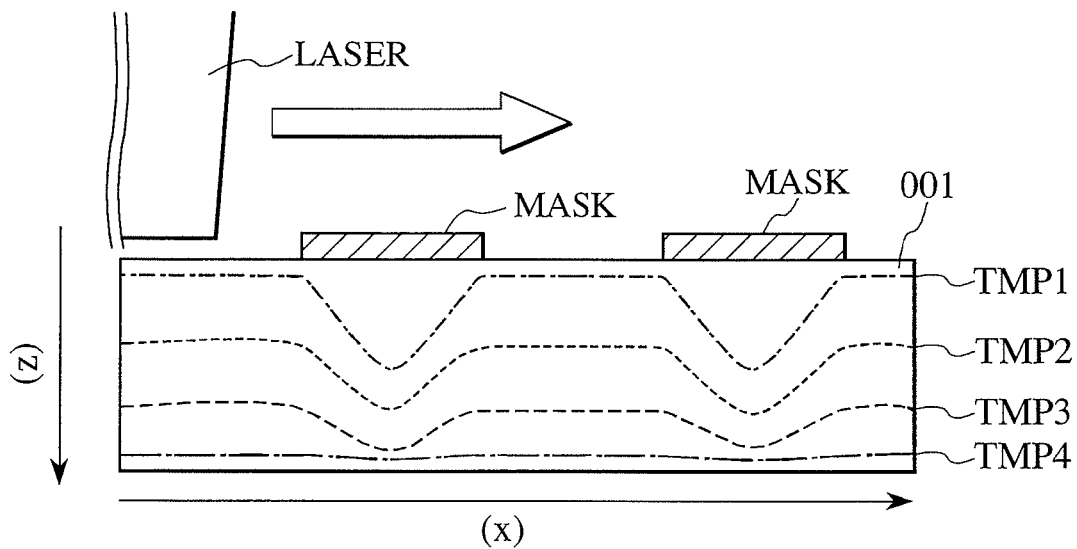
Figure 2C:
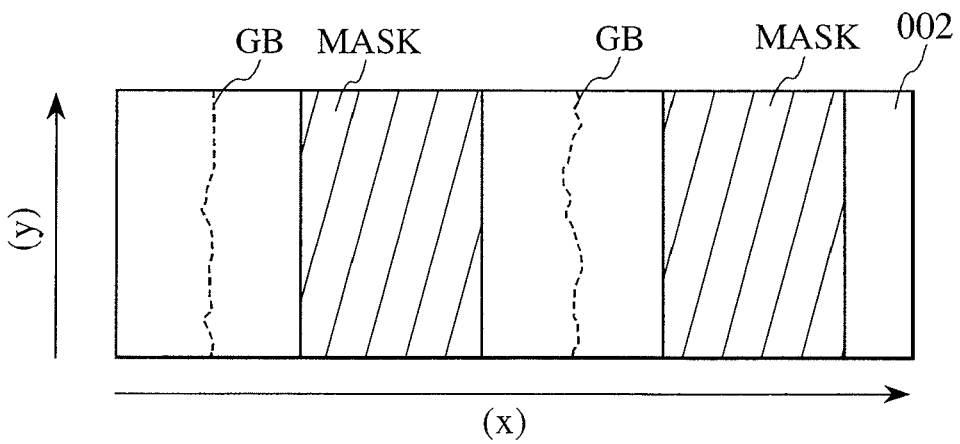
Figure 8:
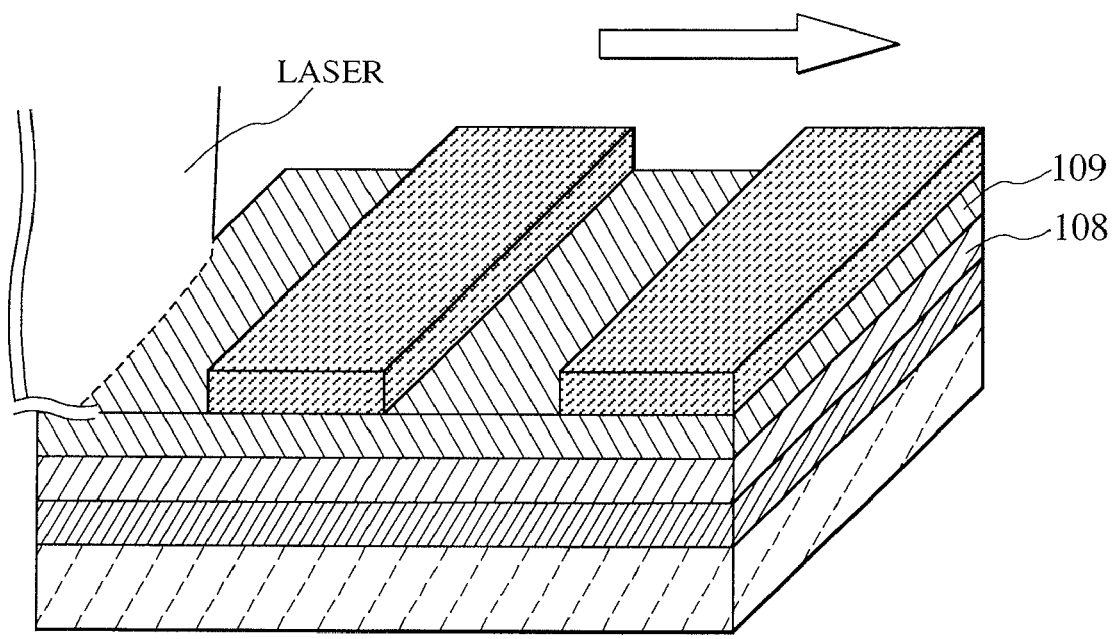
FIG. 8 is a perspective view during a manufacturing step of the semiconductor device succeeding to FIG. 7.

FIG. 8 shows a step of applying laser annealing to the surface of the structure shown in FIG. 7 for crystallizing and activating the first amorphous silicon layer 103 and the second amorphous silicon layer 104. An arrow in the drawing shows the preceding direction of laser scanning. In the annealing, as has been described above with reference to FIG. 2A to FIG. 2C, the temperature of the portions of the first amorphous silicon layer 103 and the second amorphous silicon layer 104 which are below the light reflection layer 107 are lower than the temperature of the portions of the first amorphous silicon layer 103 and the second amorphous silicon layer 104 where the light reflection layer 107 is not present thereabove since the laser is absorbed to or reflected at the light reflection layer 107. Accordingly, since crystallization starts from the portions of the first amorphous silicon layer 103 and the second amorphous silicon layer 104 which are below the light reflection layer 107, grain boundaries are formed at the portions of the first amorphous silicon layer 103 and the second amorphous silicon layer 104 where the light reflection layer 107 is not present thereabove and the yield of the selection device can be improved.

By performing crystallization and impurity activation for the first amorphous silicon layer 103 and the second amorphous silicon layer 104 by the laser annealing, the first polysilicon layer 108 and the second polysilicon layer 109 are formed. In this embodiment, the selection device constituting the memory cell is a pn diode. Accordingly, while the manufacturing method has been explained using the case of a selection device in which the junction between the first polysilicon layer 108 and the second polysilicon layer 109 is the pn junction, a selection device having other junction such as an np junction or a pin junction, or a Schottky junction with the first metal interconnect layer 102 may also be used for the memory cell.

Figure 9:
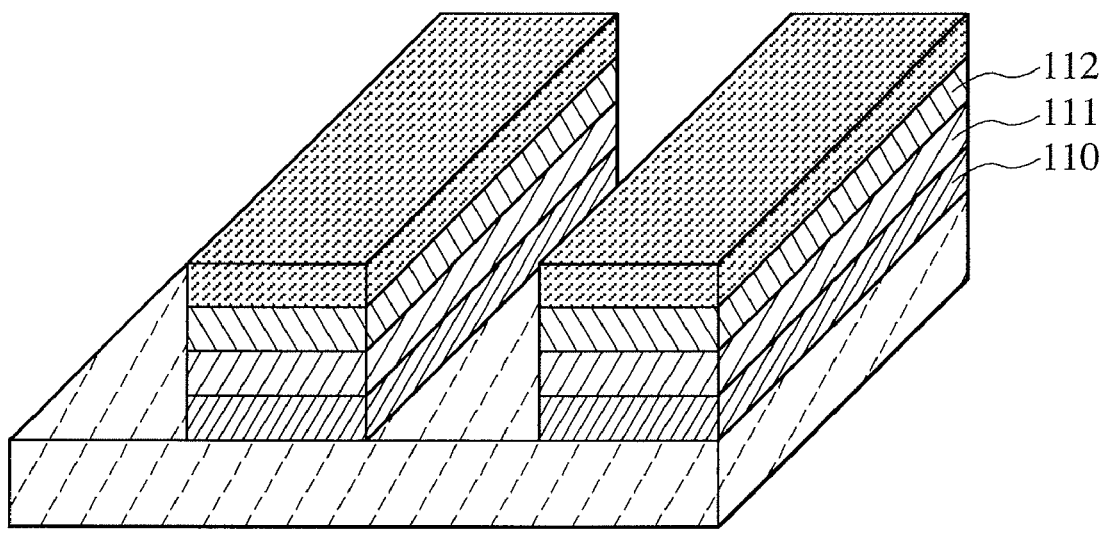
FIG. 9 is a perspective view during a manufacturing step of the semiconductor device succeeding to FIG. 8.

FIG. 9 shows a structure after etching the second polysilicon layer 109, the first polysilicon layer 108, and the first metal interconnect layer 102 by a known dry etching technique using the light reflection layer 107 shown in FIG. 8 as a mask. The pattern of a stacked film comprising the first metal interconnect layer 110, a first polysilicon layer 111, a second polysilicon layer 112 and the light reflection layer 107 reflects the pattern of the resist 106 to form a pattern of a longitudinal stripe. Further, while the first metal interconnect layer 102 is electrically connected as a word line with the semiconductor substrate 101 so that reading from and writing to the non-volatile memory can be performed but this is not illustrated in the drawing.

Figure 10:
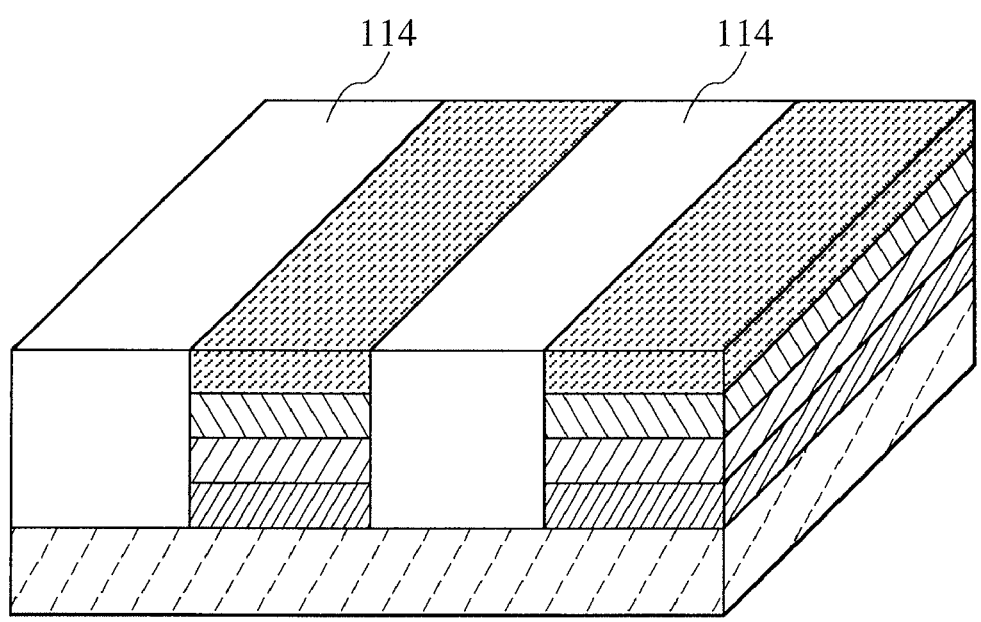
FIG. 10 is a perspective view during a manufacturing step of the semiconductor device succeeding to FIG. 9.

FIG. 10 shows a structure after scraping an insulative material deposited on the structure shown in FIG. 9 by HDP-CVD (High density plasma CVD) by using CMP (Chemical Mechanical Polishing) which is a known technique. The amount of scraping is preferably such an amount that the surface height is identical between an insulative material 114 and the light reflection layer 107. As another method, it is also possible to scrape the light reflection layer 107 such that the light reflection layer 107 is removed in the CMP step. In this case, since the effect of the resistance of the light reflection layer no more exerts, a memory cell capable of suppressing the voltage drop due to the resistance of the light reflection layer upon writing and reading and capable of operation with less power consumption can be obtained.

Figure 11:
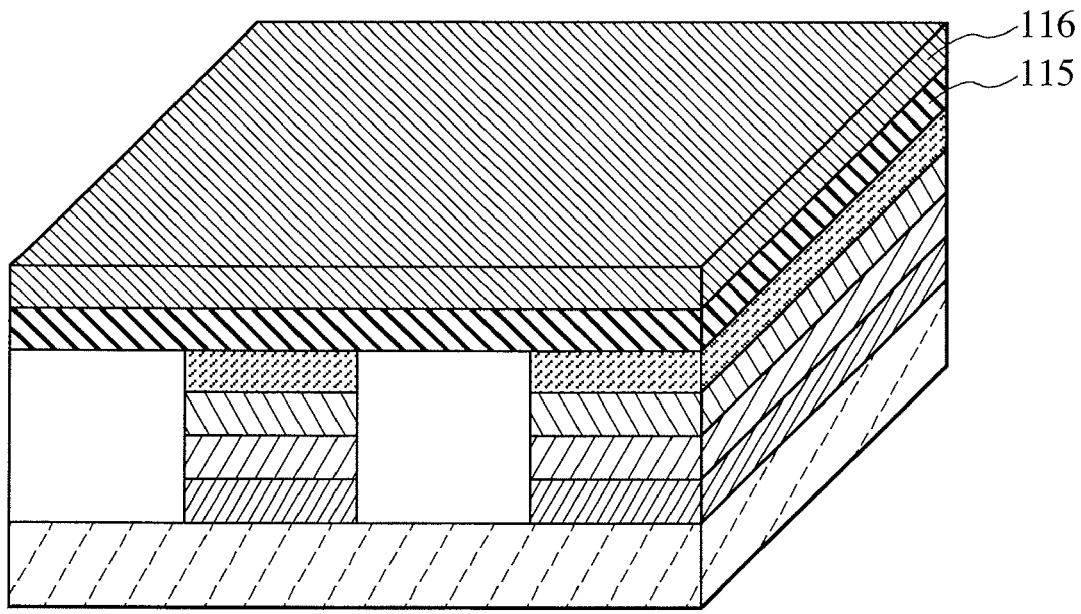
FIG. 11 is a perspective view during a manufacturing step of the semiconductor device succeeding to FIG. 10.

FIG. 11 shows a structure after depositing a non-volatile recording material layer 115 and a second metal interconnect layer 116 above the structure shown in FIG. 10 by sputtering. The material of the non-volatile recording material layer 115 is $Ge_2Sb_2Te_5$ and the layer has a thickness of 5 nm or more and 300 nm or less and, more preferably, has a thickness of 5 nm or more and 50 nm or less of low aspect ratio so that dry etching and burying of the insulative material can be performed easily in the subsequent step. In this embodiment, while the material of the non-volatile recording material layer 115 has been explained with the example of $Ge_2Sb_2Te_5$, an identical level of performance can be obtained by selecting a composition with a material containing at least one element of chalcogen elements (S, Se, Te). The material of the second metal interconnect layer 116 is tungsten and, more preferably, aluminum or copper of low resistivity.

Figure 12:
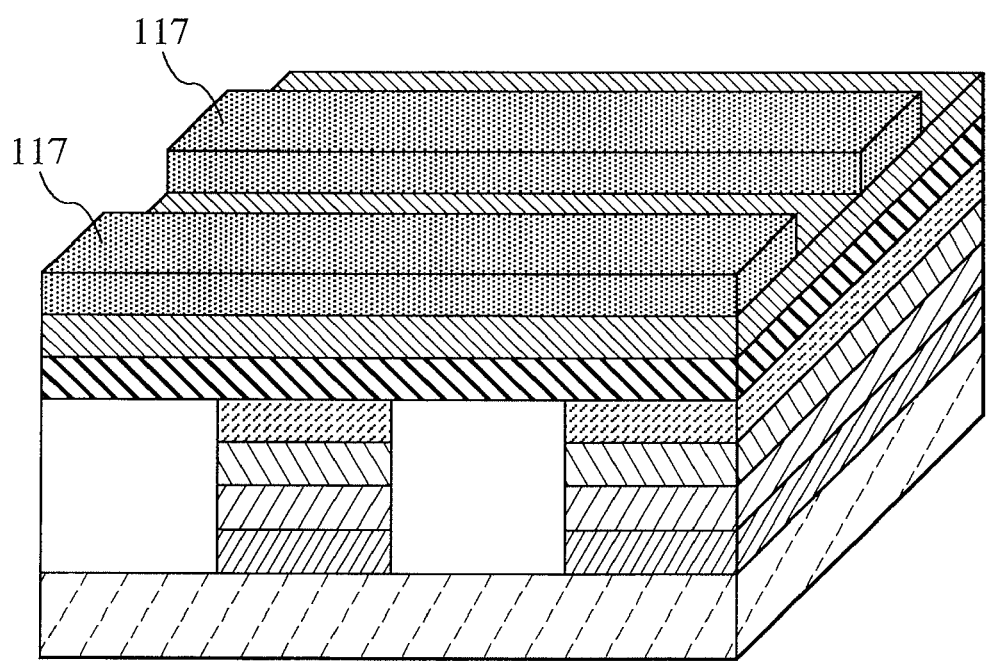
FIG. 12 is a perspective view during a manufacturing step of the semiconductor device succeeding to FIG. 11.

FIG. 12 shows a structure after patterning the resist by a known lithographic technique above the structure shown in FIG. 11. The pattern of the resist 117 is a pattern of a bit line and formed so as to extend in parallel with the pattern of an adjacent bit line above the memory matrix. Further, the pattern of the resist 117 is formed so as to intersect the pattern of the first metal interconnect layer 110.

Figure 13:
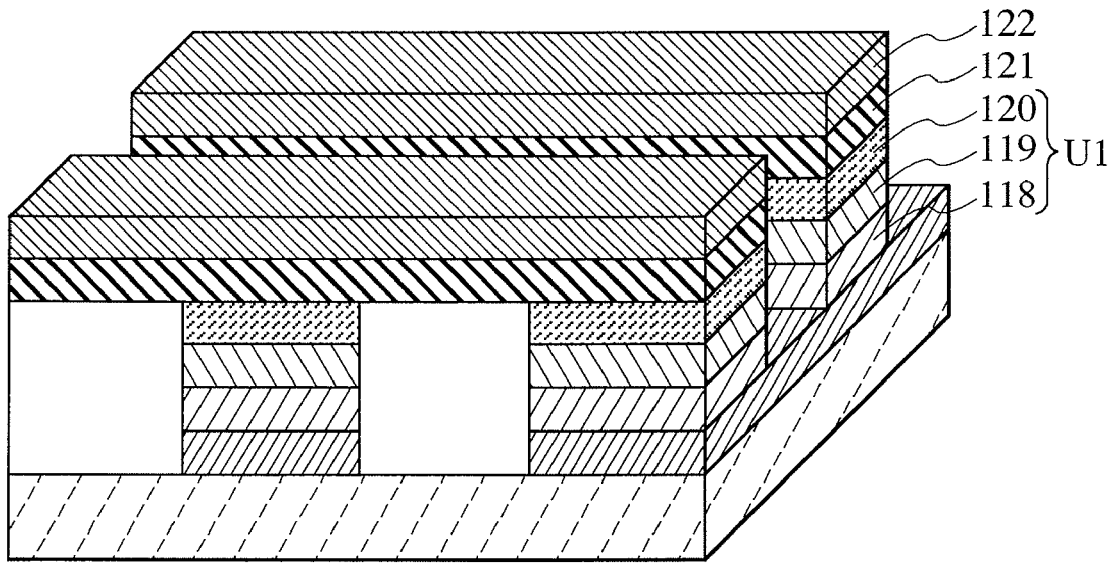
FIG. 13 is a perspective view during a manufacturing step of the semiconductor device succeeding to FIG. 12.

FIG. 13 shows a structure after fabricating the second metal interconnect layer 116, the non-volatile recording material layer 115, the light reflection layer 117, the second polysilicon layer 112, the first polysilicon layer 111, and the insulative material 114 by a known dry etching technique using the resist 117 shown in FIG. 12 as a mask and removing the resist 117 by a known technique. In this case, fabrication is applied while leaving the first metal interconnect layer 110 corresponding to the word line of the memory matrix so that the memory cell can be selected. A stacked film U1 comprising the first polysilicon layer 118, the second polysilicon layer 119, and the light reflection layer 120 after the fabrication has a pillar shape. Further, the non-volatile recording material layer 121 and the second metal interconnect layer 122 are of a shape identical with that of the pattern of the resist 117.

Figure 14:
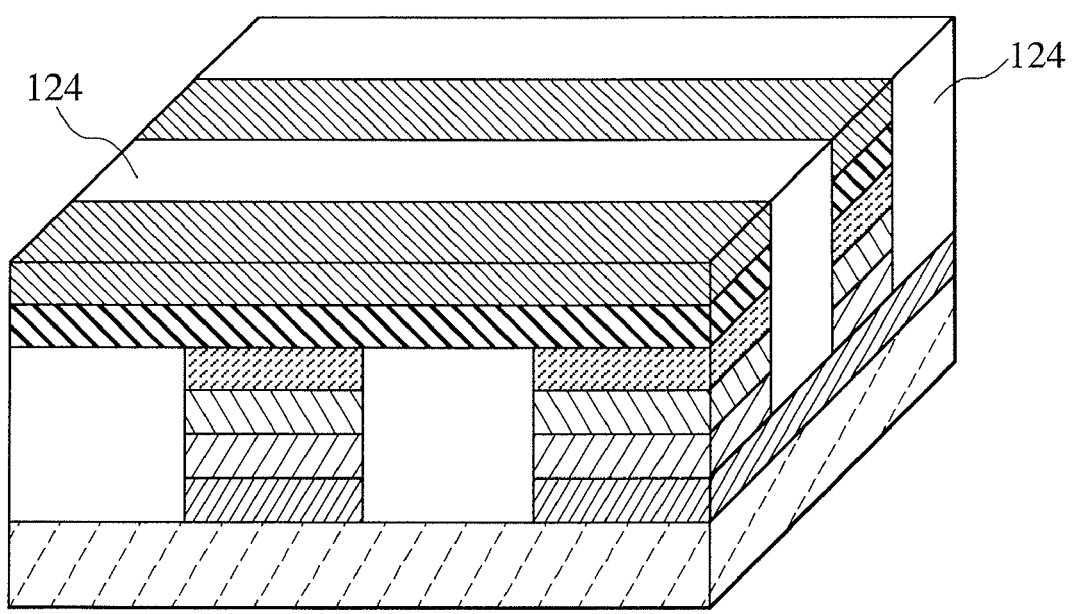
FIG. 14 is a perspective view during a manufacturing step of the semiconductor device succeeding to FIG. 13.

FIG. 14 shows a structure after filling an insulative film between the patterns by HDP-CVD above the structure shown in FIG. 13 and then performing scraping by CMP which is a known technique. The amount of scraping is desirably such an amount that the surface height is identical between the insulative material 124 and the second metal interconnect layer 122. Further, the second metal interconnect layer 122 is electrically connected as a bit line with a peripheral circuit so that reading from and writing to the non-volatile memory can be performed. In a case of this embodiment shown in FIG. 4A, a contact for connection between the bit line and the peripheral circuit is provided and the bit line and the peripheral circuit are connected at the contact portion.

Figure 15:
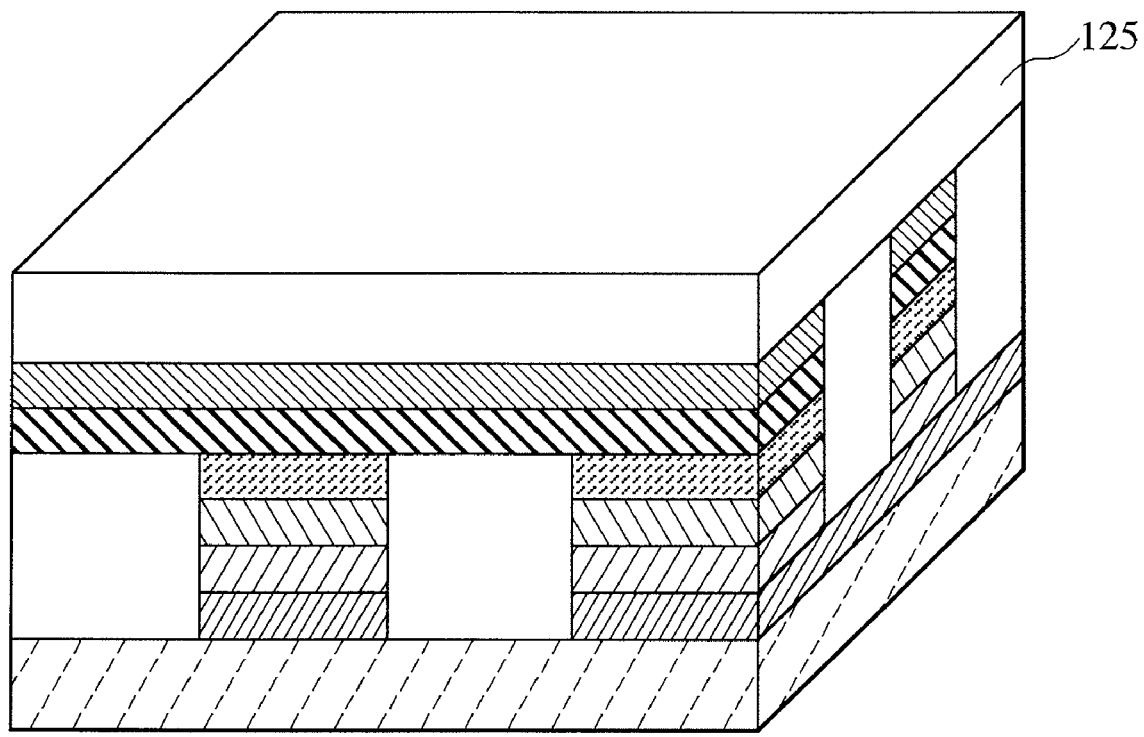
FIG. 15 is a perspective view during a manufacturing step of the semiconductor device succeeding to FIG. 14.

FIG. 15 shows a structure after depositing an insulative material 125 above the structure shown in FIG. 14.

Figure 16:
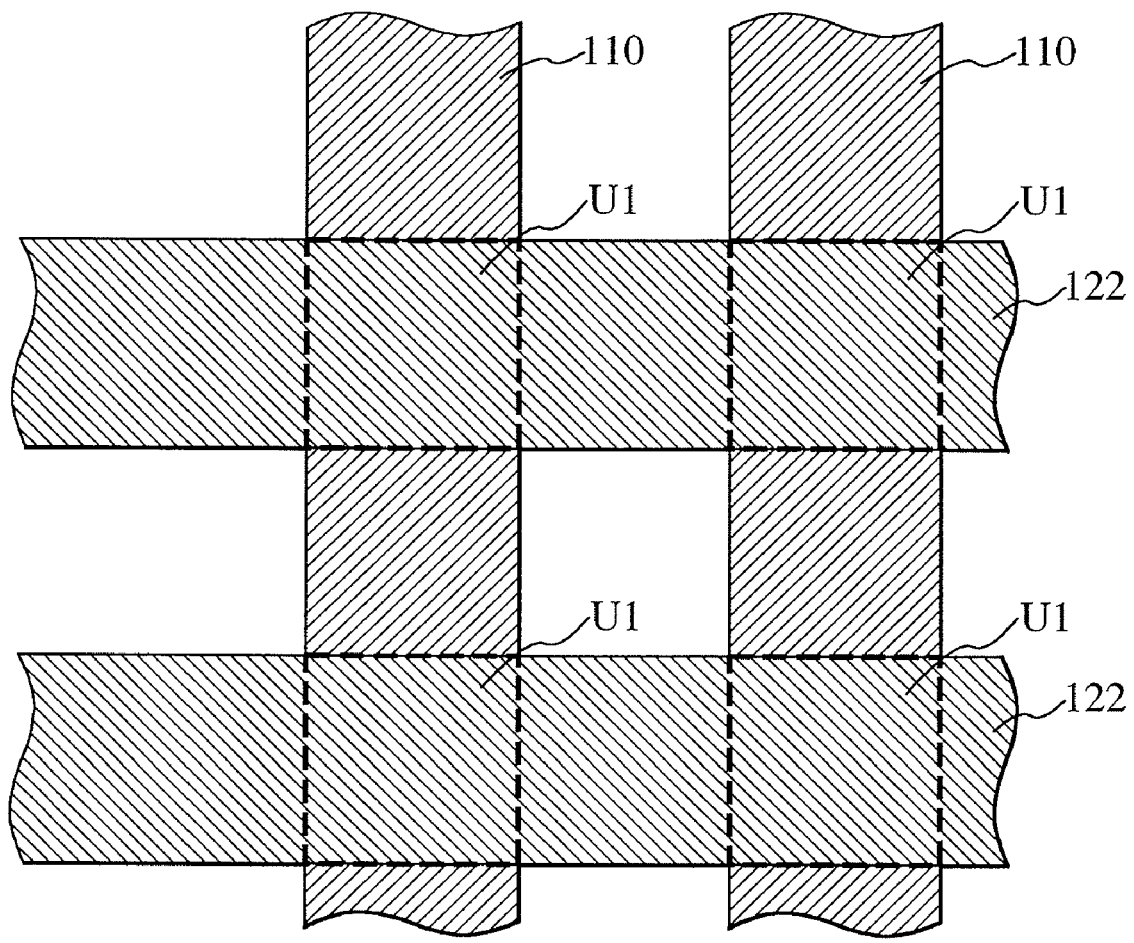
FIG. 16 is an upper plan view corresponding to the structure described in FIG. 15.

FIG. 16 shows an upper plan view of a memory cell manufactured by a manufacturing method described with reference to FIG. 5 to FIG. 15. The first metal interconnect layer 110 as the word line and the second metal interconnect layer 122 as the bit line of a memory cell intersect each other, and the stacked film U1 is disposed at the intersection thereof. With such a structure, a memory cell matrix of high integration degree can be constituted.

An operation method of the memory matrix applied with the memory cell of the non-volatile memory of the invention is to be described with reference to the drawings.

Figure 17:
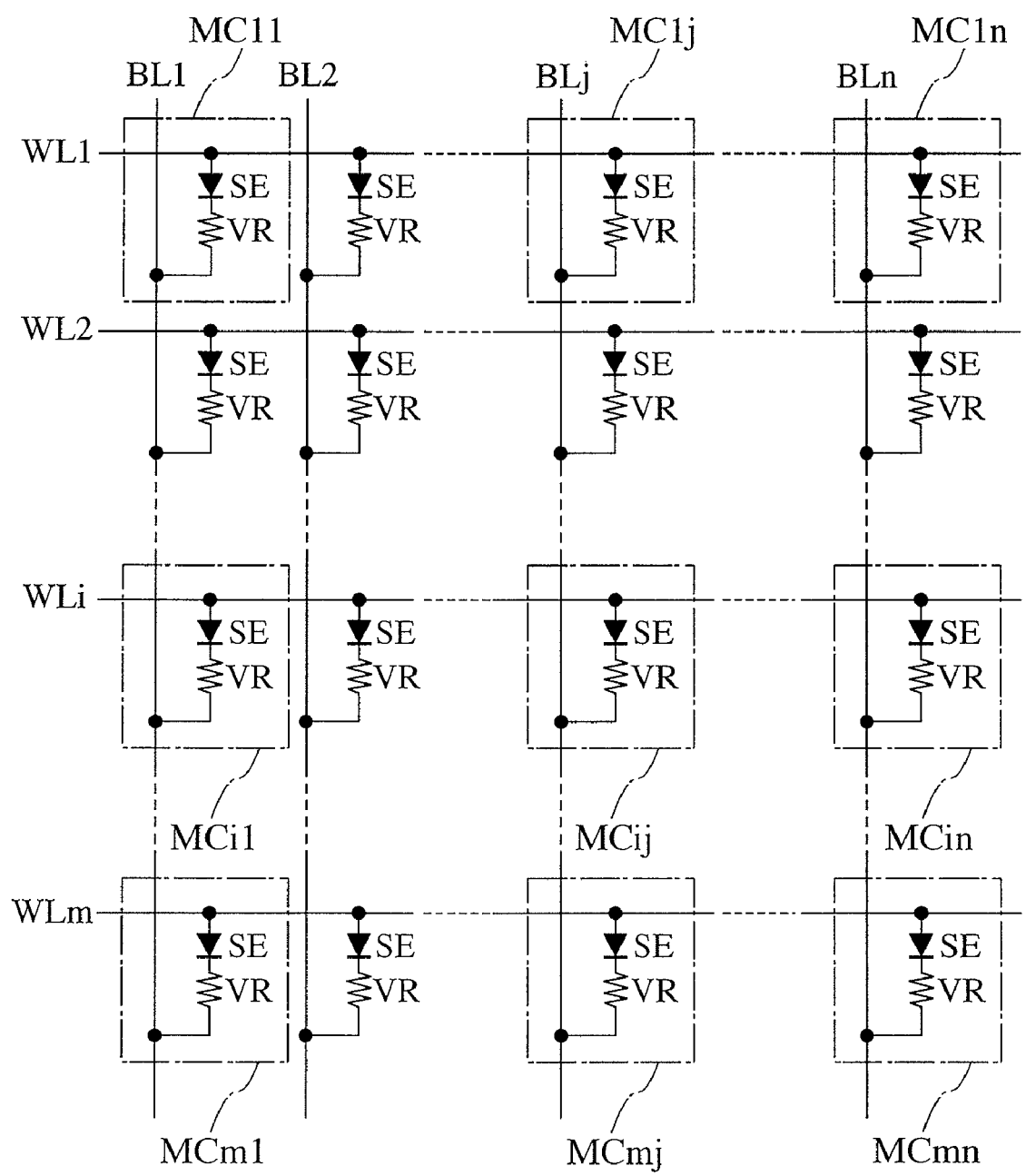
FIG. 17 is a circuit diagram of a main portion of a memory matrix of a semiconductor device according to the invention.

FIG. 17 is a constitutional view of an equivalent circuit of a memory cell array of a non-volatile memory. The circuit has a structure in which each of memory cells MCij (i=1, 2, 3, - - -, m) (j=1, 2, 3, - - -, n) is disposed at each of intersections between a plurality of first interconnects WLi (i=1, 2, 3, - - -, m) disposed in parallel (hereinafter referred to as word lines) and a plurality of second interconnects BLj (j=1, 2, 3, - - -, n) (hereinafter referred to as bit lines) disposed in parallel so as to intersect the word lines WLi, and the selection device SE and the phase change resistance device VR are connected in series. In the drawing, while one end of the selection device SE is connected with the word line WLi and one end of the phase change resistance device VR is connected with the bit line BLj, one end of the selection device SE may be connected with the bit line BLj and one end of the phase change resistance device VR may be connected with the word line WLi for selecting the memory cell depending on the way of applying a voltage to the word line WLi and the bit line BLj, as described later.

Recording in the non-volatile memory is performed as described below. For example, in a case of rewriting to the memory cell MC11, information is stored by applying voltage Vh to the first word line WL1, voltage V1 to other word line WLi, voltage V1 to the first bit line BL1, and voltage Vh to other bit line BLj and supplying a current to the phase change resistance device of MC11. In this case, voltage Vh is higher than the voltage V1. Upon rewriting, a selection device SE having a function of preventing erroneous writing to a not-selected memory cell is required. Naturally, the voltage Vh should be equal to or lower than the yield voltage of the selection device SE. The non-volatile memory is read out as described below. For example, in a case of reading the information in the memory cell MC11, information is read out by applying voltage Vm to the first word line WL1, voltage V1 to other word line WLi, and voltage V1 to the first bit line BL1 and measuring the level of the current flowing through BL1.

Figure 18:
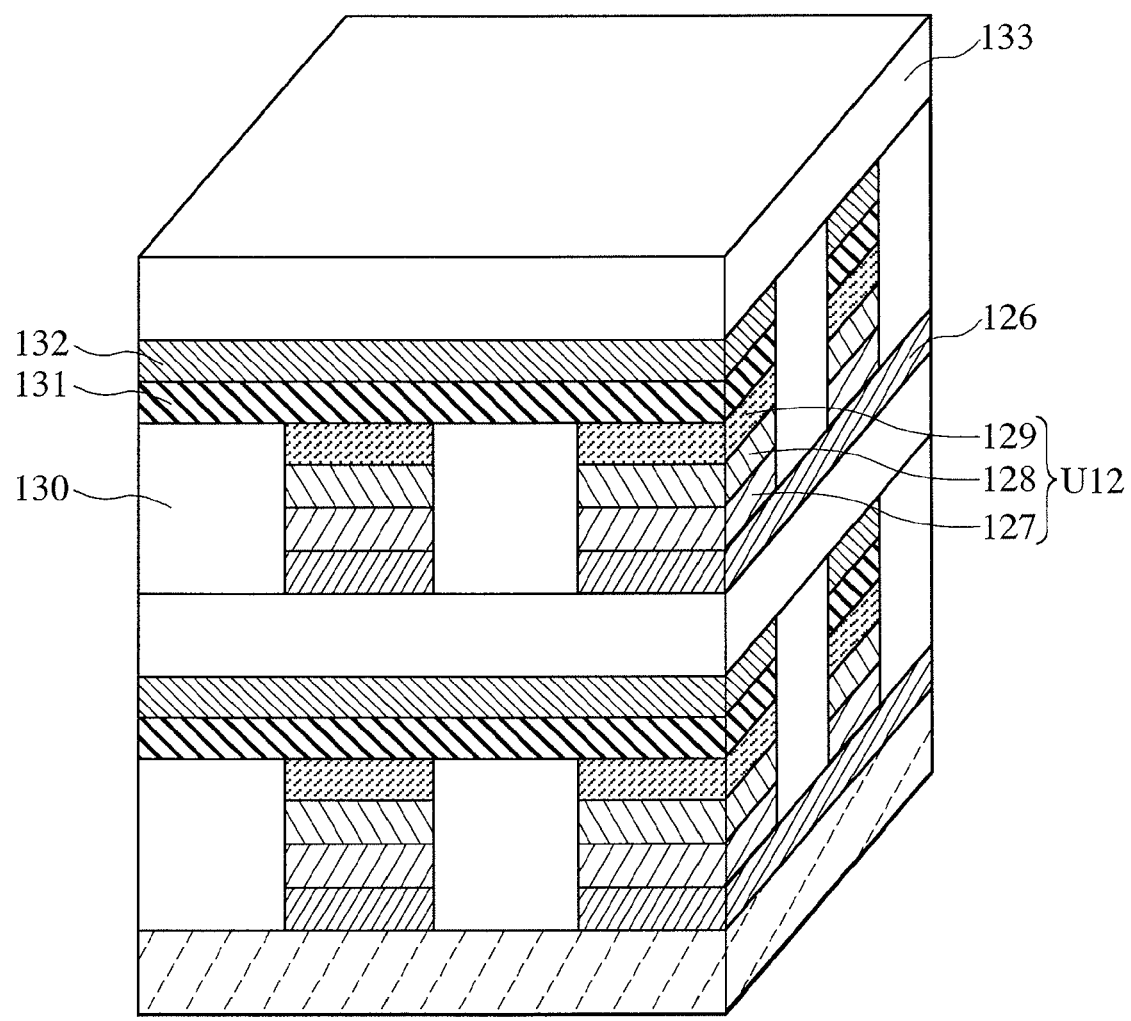
FIG. 18 is a perspective view of a semiconductor device according to Embodiment 1 of the invention during a manufacturing step.

While a manufacturing method in the case of the single layer memory matrix having only the first layer has been described, stacking of the memory matrix is more preferred for increasing the bit density of the memory cell. For example, in a case of stacking the memory matrix by two layers as shown in FIG. 18, this manufacturing method can be attained by forming, above the structure shown in FIG. 15, that is, above the insulative material 125, a first metal interconnect layer 126 as a word line of the second layer, a pillar stacked film U12 of the second layer, the U12 comprising a first polysilicon layer 127 of the second layer, a second polysilicon layer 128 of the second layer, and a light reflection layer 129 of the second layer of the memory matrix, an insulative material 130, a phase change material layer 131, a second metal interconnect layer 132 corresponding to the bit line of the second layer and an insulative material 133 of the memory matrix in the same manner as shown in FIG. 5 to FIG. 15 in this embodiment. Further, also in a case of stacking a plurality of memory matrix layers by the number of k (k=1, 2, 3, - - - , l), the memory matrix is manufactured by the same method. Naturally, in a case of stacking the plurality of memory matrix layers, the layer has to be selected upon recording on and reading from the non-volatile memory. The layer is selected such that a layer to be written can be selected by the bit line, for example, in a case of forming the word lines in common for each layer.

As the material of the light reflection layer, also in a case of using a metal or an alloy containing 70 at % or more of W, Mo, or Al, or a material of an atom number ratio represented by the following general formula (1):

$$A_X B_Y \tag{1}$$

(where X and Y represent each: $0.3 \leq X \leq 0.7$ and $0.3 \leq Y \leq 0.7$, A represents at least one element selected from the group consisting of Zn, Cd, Ga, In, Si, Ge, Sn, V, Nb, Ta, Cr, Ti, Zr, and Hf, and B represents at least one element selected from the group consisting of N, and O), instead of CdS, a reflection effect and a crystal grain boundary eliminating effect attributable thereto can be obtained. However, a driving voltage increases in a film of high electric resistance. When X is excessively small, the reflectance is low since the difference of the optical constant is small and, on the other hand, conductivity is excessively high when X is excessively high. The situations are reversed in a case of Y.

Embodiment 1 has been described above. In this embodiment, by using the light reflection layer 105, a region of high temperature and a region of a relatively low temperature are temporarily formed in the horizontal direction in the second amorphous silicon layer 104 and in the first amorphous silicon layer 103 upon laser irradiation. Since this relatively lowers the temperature in the region where the light reflection layer is present and relatively increases the temperature outside of the region, crystal grain boundaries GB of polysilicon are formed outside of the region. Then, the region where the temperature is increased relatively, that is, a region where the grain boundaries are generated, is removed by patterning in the subsequent step, thereby finally forming the diode constituted with a polysilicon layer with less grain boundaries. Accordingly, variation in the property of the diode can be decreased and the yield of the phase change memory can be improved. Further, in this embodiment, by using the light reflection layer as a mask for patterning the polysilicon layer, the region where the grain boundaries are generated can be removed in a self-alignment manner without further positioning to the region. That is, the light reflection layer has both a function of a mask for controlling the grain boundary and that of a mask for patterning polysilicon, and this can save the processing steps compared with the case where respective functions are used independently in different steps.

Embodiment 2

Figure 19:
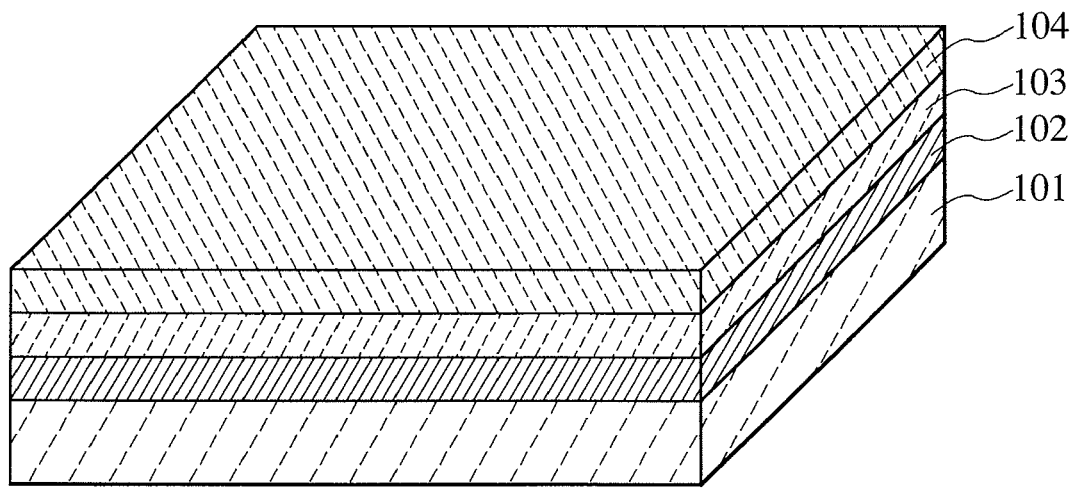
FIG. 19 is a perspective view of a semiconductor device according to Embodiment 2 of the invention during a manufacturing step.

In this embodiment, a memory cell of the invention is formed above a semiconductor substrate 101 shown in FIG. 19. The semiconductor substrate 101 includes a peripheral circuit for operating the memory matrix of a non-volatile memory. The peripheral circuit is manufactured by an existent CMOS technique. The positional relation between the peripheral circuit and the memory matrix is identical with that in Embodiment 1.

FIG. 19 shows the structure of depositing, above the semiconductor substrate 101, a first metal interconnect layer 102, a first amorphous silicon layer 103, and a second amorphous silicon layer 104 successively. The first metal interconnect layer 102 is formed by sputtering. The material of the first metal interconnect layer 102 is tungsten. Since a material of lower resistivity shows less voltage drop and can provide a read current, aluminum or copper which is a material of lower resistivity than that of tungsten is more preferred. Further, a metal compound such as TiN may be deposited between the first metal interconnect layer 102 and the semiconductor substrate 101 for improving adhesion. Further, tungsten silicide or titanium silicide may also be formed between the first amorphous silicon layer 103 and the first metal interconnect layer 102 for lowering the boundary resistance by using a known silicide technique.

The first amorphous silicon layer 103 is formed of amorphous silicon containing boron, gallium, or indium, and the second amorphous silicon layer 104 is formed of intrinsic amorphous silicon. In a case where the first metal interconnect layer 102 is formed of tungsten, boron-containing amorphous silicon is preferred than gallium- or indium-containing amorphous silicon as the material for forming the first amorphous silicon layer 103, since the boundary resistance between the first amorphous silicon layer 103 and the first metal interconnect layer 102 is lowered. The first amorphous silicon layer 103 and the second amorphous silicon layer 104 are formed by LP-CVD. The first amorphous silicon layer 103 has a thickness of 10 nm or more and 250 nm or less, and the second amorphous silicon layer 104 has a thickness of 10 nm or more and 250 nm or less. Then, by ion-implanting phosphor to the second amorphous silicon layer 104, an $n^+$ type semiconductor region is formed. While phosphor is referred to as the ion to be implanted herein, it may also be arsenic. Further, the second amorphous silicon layer 104 may be formed previously as amorphous silicon containing phosphor or arsenic thereby saving the number of processing steps.

Figure 3A:
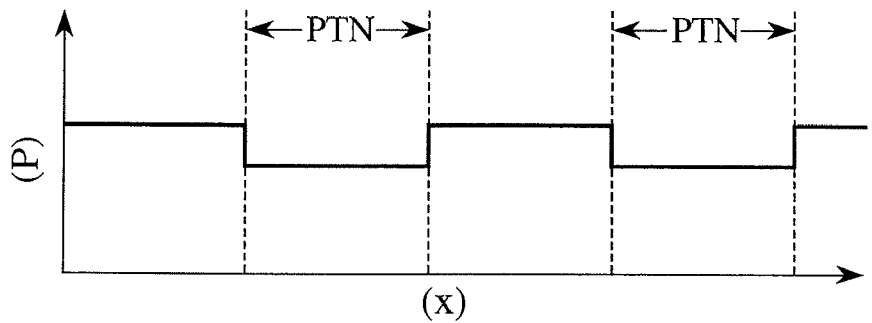
FIGS. 3A, 3B, and 3C are views showing a laser irradiation position of a specimen, a laser intensity, a temperature profile, and a crystal state.
Figure 3B:
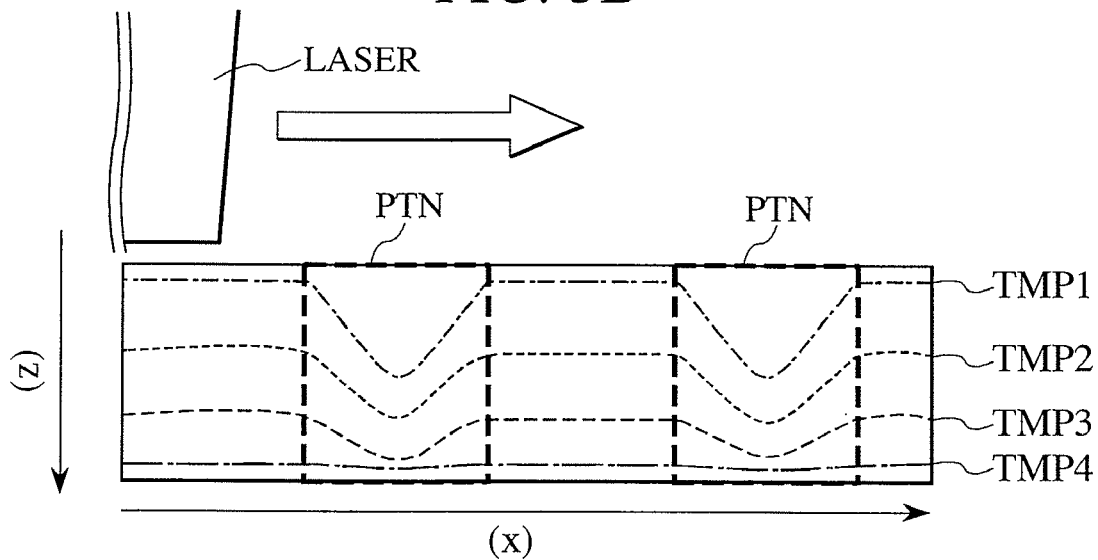
Figure 3C:
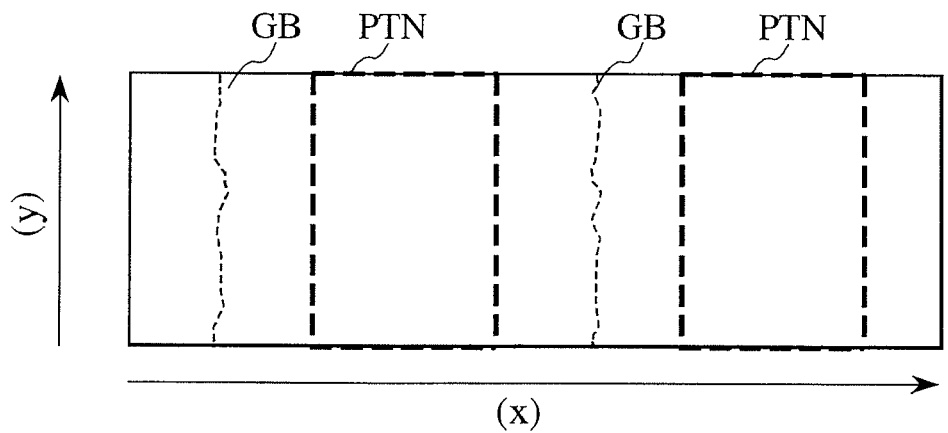
Figure 20:
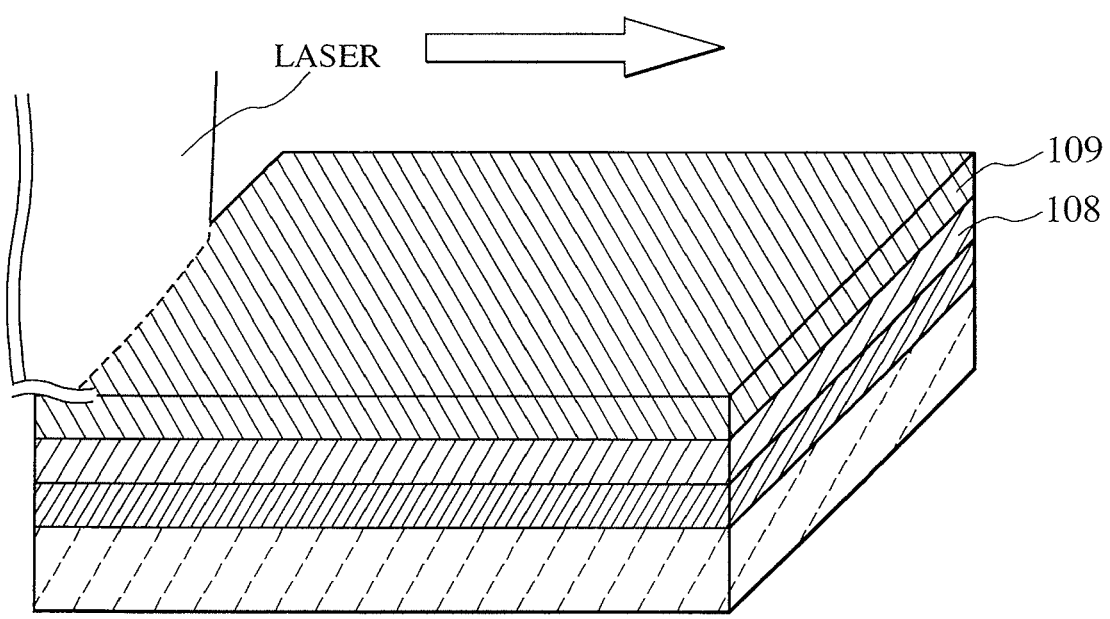
FIG. 20 is a perspective view of the semiconductor device during a manufacturing step succeeding to FIG. 19.

FIG. 20 shows a step of applying laser annealing to the surface of the structure shown in FIG. 19 for crystallizing and activating the first amorphous silicon layer 103 and the second amorphous silicon layer 104. In the annealing, as has been described above with reference to FIG. 3A to FIG. 3C, the temperature at the portions of the first amorphous silicon layer 103 and the second amorphous silicon layer 104 on the pattern is lower than the temperature at the portions of the first amorphous silicon layer 103 and the second amorphous silicon layer 104 which are out of the pattern since the laser power is weakened on the pattern of the word line to be formed in the subsequent step. Accordingly, since crystallization starts from the portions of the first amorphous silicon layer 103 and the second amorphous silicon layer 104 which are out of the pattern, grain boundaries can be eliminated from the portion on the pattern and the yield of the selection device can be improved. Further, a phase change memory of high yield can be manufactured at a low cost without requiring the identical step as in the Embodiment 1.

By performing crystallization and impurity activation for the first amorphous silicon layer 103 and the second amorphous silicon layer 104 by the laser annealing, the first polysilicon layer 108 and the second polysilicon layer 109 are formed. In this embodiment, the selection device constituting the memory cell is a pn diode. Accordingly, while the manufacturing method has been explained with the case of a selection device in which the junction between the first polysilicon layer 108 and the second polysilicon layer 109 is the pn junction, a selection device having other junction such as an np junction or a pin junction, or a Schottky junction with the first metal interconnect layer 102 may also be used for the memory cell.

Figure 21:
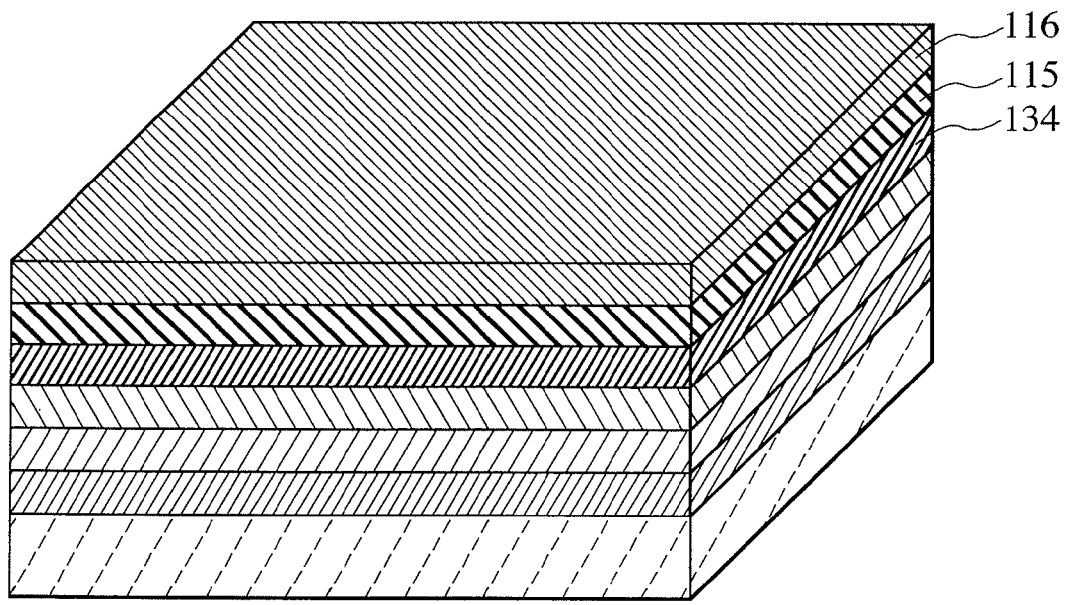
FIG. 21 is a perspective view of the semiconductor device during a manufacturing step succeeding to FIG. 20.

FIG. 21 shows a structure after depositing the buffer layer 134, the non-volatile recording material layer 115 and a second metal interconnect layer 116 above the structure shown in FIG. 20 successively.

The material of the buffer layer 134 has an average composition in the direction of the layer thickness at an atom number ratio, for example, represented by the following general formula (1):

$$A_X B_Y \quad (1)$$

(where X and Y each represents: $0.3 \leq X \leq 0.7$, and $0.3 \leq Y \leq 0.7$, A is at least one element selected from the group consisting of Cu, Ag, Zn, Cd, Al, Ga, In, Si, Ge, V, Nb, Ta, Cr, Mo, W. Ti, Zr, Hf, Fe, Co, Ni, Pt, Pd, Rh, Ir, Ru, Os, lanthanide elements and actinide elements, and B is at least one element selected from the group consisting of N, O, and S, and the buffer layer is disposed for preventing diffusion of impurities from the side of the non-volatile recording material layer to the diode.

When X is excessively small, heat resistance is low and, when it is excessively large, electroconductivity is excessively high. The situations are reversed in the case of Y. The layer thickness is preferably 1 nm or more and 50 nm or less. In a case where the thickness is excessively thin, the buffer effect is insufficient. On the other hand, when the thickness is excessively large, the resistance is high and the driving voltage also increases. When there is no requirement for preventing diffusion of impurities, it is not always necessary to dispose the buffer layer 134.

The material of the non-volatile recording material layer 115 is $Ge_2Sb_2Te_5$ and has a layer thickness of 5 nm or more and 300 nm or less. More preferably, it has a layer thickness of 5 nm or more and 50 nm or less of low aspect ratio so that dry etching and burying of the insulative material in the subsequent steps can be performed easily. In this embodiment, while the material of the non-volatile recording material layer 115 has been explained with an example of $Ge_2Sb_2Te_5$, performance at an identical level can be obtained by selecting the composition with the material containing at least one element of chalcogen elements (S, Se, Te). The material of the second metal interconnect layer 116 is tungsten and, more preferably, aluminum or copper of low resistivity.

Figure 22:
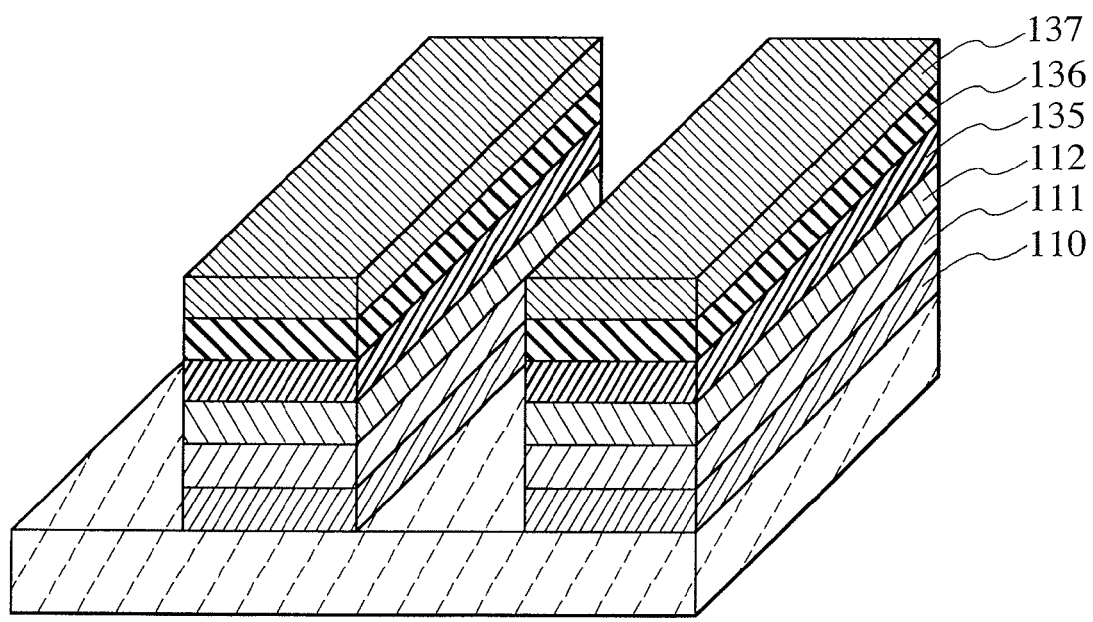
FIG. 22 is a perspective view of the semiconductor device during a manufacturing step succeeding to FIG. 21.

FIG. 22 shows a structure after processing the second metal interconnect layer 116, the non-volatile recording material layer 115, the buffer layer 134, the second polysilicon layer 109, the first polysilicon layer 108, and the first metal interconnect layer 102 from the structure shown in FIG. 21 by using known lithographic technique and dry etching technique. A pattern of the stacked film comprising the first metal interconnect layer 110, the first polysilicon layer 111, the second polysilicon layer 112, the buffer layer 135, the non-volatile recording material layer 136, and the second metal interconnect layer 137 is a pattern of the word line and formed so as to extend in parallel with an adjacent pattern above the memory matrix. Further, while the first metal interconnect layer 110 is electrically connected as the word line of the memory matrix with the semiconductor substrate 101 so that reading from and writing to the non-volatile memory can be performed, this is not illustrated in the drawing.

Figure 23:
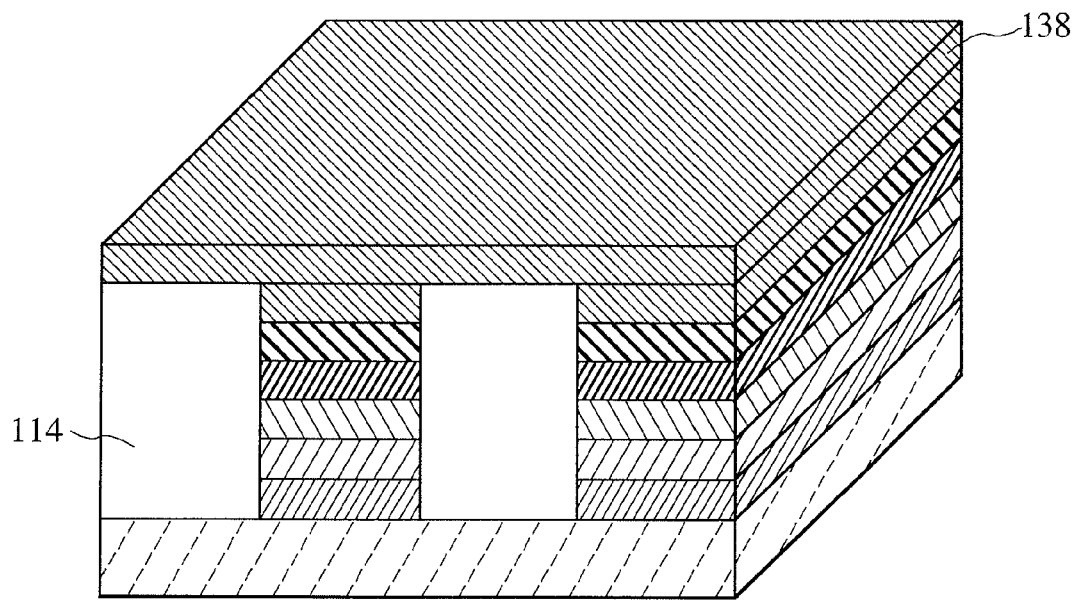
FIG. 23 is a perspective view of the semiconductor device during a manufacturing step succeeding to FIG. 22.

FIG. 23 shows a structure after filling an insulative material between the patterns by using HDP-CVD above the structure shown in FIG. 22, then after performing planarization by CMP, depositing of the third metal interconnect layer 138 is performed by sputtering.

Figure 24:
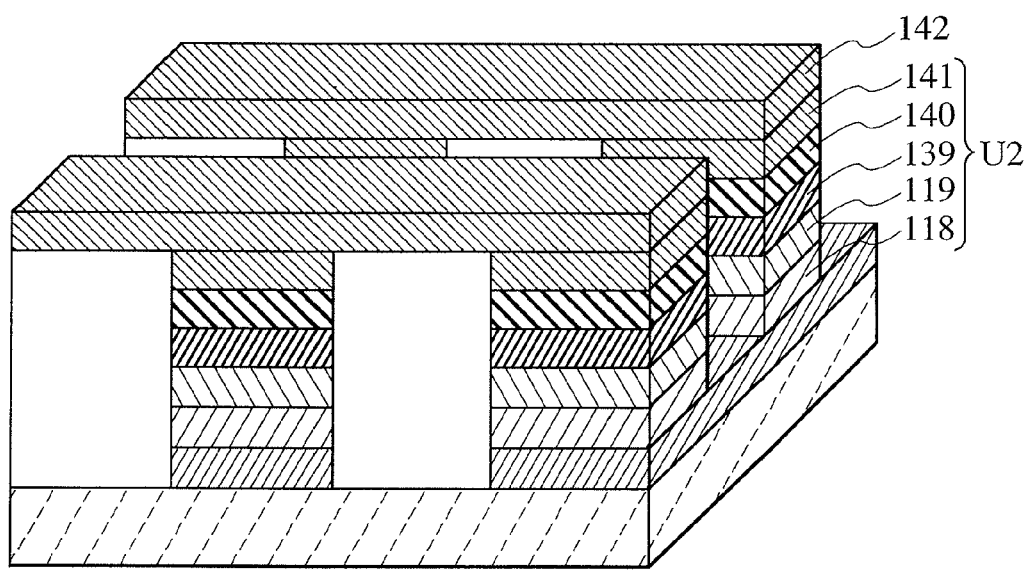
FIG. 24 is a perspective view of the semiconductor device during a manufacturing step succeeding to FIG. 23.

FIG. 24 shows a structure after processing a third metal interconnect layer 138, a second metal interconnect layer 137, a non-volatile recording material layer 136, a buffer layer 135, a second polysilicon layer 112, and a first polysilicon layer 111 above the structure shown in FIG. 23 by using known lithographic technique and dry etching technique. A stacked film U2 comprising the first polysilicon layer 118, the second polysilicon layer 119, the buffer layer 139, the non-volatile recording material 140, and the second metal interconnect layer 141 forms a pillar shape. The pattern of the third metal interconnect layer 142 is a pattern of the bit line and formed so as to extend in parallel with the pattern of an adjacent bit line above the memory matrix. The pattern of the third metal interconnect layer 142 intersects the pattern of the first metal interconnect layer 110. Further, while the third metal interconnect layer 142 is electrically connected as the bit line of the memory matrix with the semiconductor substrate 101 so that reading from and writing to the non-volatile memory can be performed, this is not illustrated in the drawing.

Figure 25:
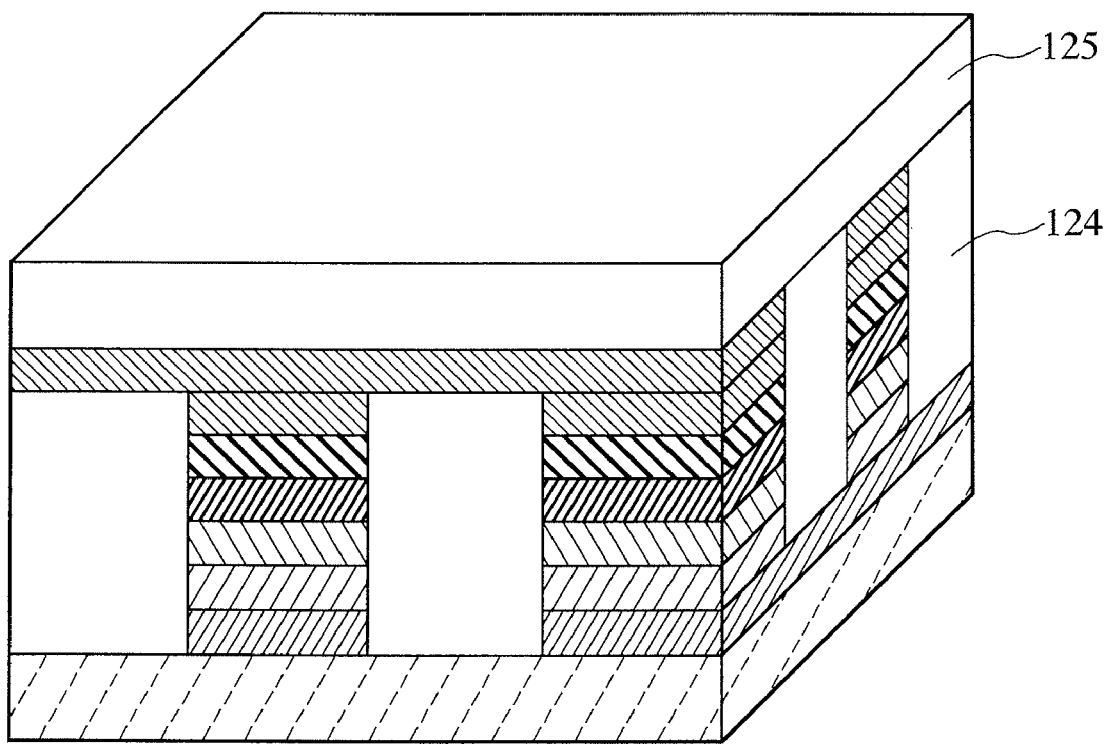
FIG. 25 is a perspective view of the semiconductor device during a manufacturing step succeeding to FIG. 24.

FIG. 25 shows a structure after filling an insulative material 124 between the patterns by using HDP-CVD above the structure shown in FIG. 24, then after performing planarization by CMP, depositing of the insulative material 125 is performed.

Figure 26:
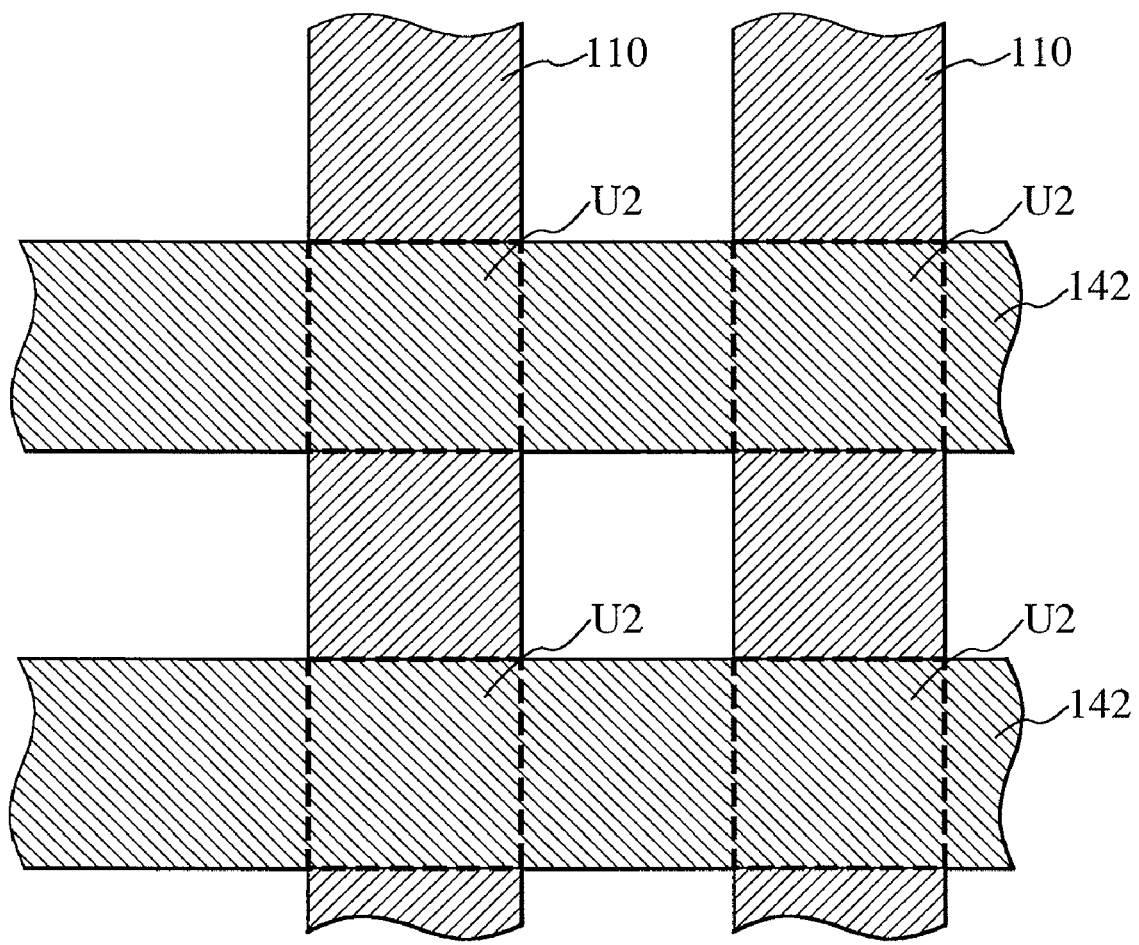
FIG. 26 is an upper plan view corresponding to the structure described in FIG. 25.

FIG. 26 shows an upper plan view of the memory cell manufactured by the manufacturing method described with reference to FIG. 19 to FIG. 25. The first metal interconnect layer 110 as the word lines and the third interconnection metal layer 142 as the bit lines of the memory cell intersect each other, and a stacked film U2 is disposed at each of the intersections thereof. Materials used for the respective layers are identical with those of Embodiment 1. Further, plurality of memory matrix may also be stacked like in Embodiment 1.

The operation method of the memory matrix to which the memory cell of the non-volatile memory of this embodiment is applied is identical with that of Embodiment 1.

Embodiment 3

Figure 27:
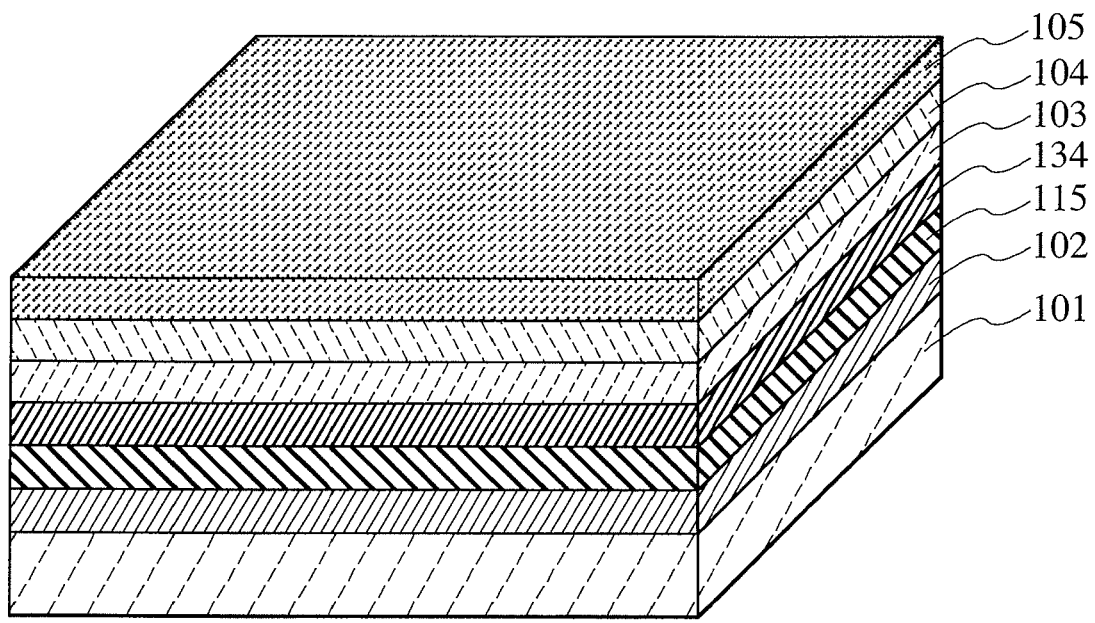
FIG. 27 is a perspective view of a semiconductor device according to Embodiment 3 of the invention during a manufacturing step.

In this embodiment, a memory cell of the invention is formed above a semiconductor substrate 101 shown in FIG. 27. The semiconductor substrate 101 includes a peripheral circuit for operating the memory matrix of a non-volatile memory. The peripheral circuit is manufactured by using an existent CMOS technique. The positional relation between the peripheral circuit and the memory matrix is identical with that in Embodiment 1. A great difference between this embodiment and Embodiments 1 and 2 is that the diode layer is on the non-volatile recording material layer.

FIG. 27 shows the structure of depositing, above the semiconductor substrate 101, the first metal interconnect layer 102, the non-volatile recording material layer 115, the buffer layer 134, the first amorphous silicon layer 103, the second amorphous silicon layer 104 and the light reflection layer 107 successively. The first metal interconnect layer 102 is formed by sputtering. The material of the first metal interconnect layer 102 is tungsten. Since a material of lower resistivity shows less voltage drop and can effectively obtain a read current, aluminum or copper which is a material of lower resistivity than that of tungsten is more preferred. Further, a metal compound such as TiN may be deposited between the first metal interconnect layer 102 and the semiconductor substrate 101 for improving adhesion. Further, tungsten silicide or titanium silicide may also be formed between the first amorphous silicon layer 103 and the buffer layer 134 for lowering the boundary resistance by using a known silicide technique.

The first amorphous silicon layer 103 is formed of amorphous silicon containing any one of boron, gallium, and indium, and the second amorphous silicon layer 104 is formed of intrinsic amorphous silicon. The first amorphous silicon layer 103 and the second amorphous silicon layer 104 are formed by LP-CVD. The first amorphous silicon layer 103 has a layer thickness of 10 nm or more and 250 nm or less, and the second amorphous silicon layer 104 has a layer thickness of 10 nm or more and 250 nm or less. Then, by ion-implanting phosphor to the second amorphous silicon layer 104, an n$^+$ type semiconductor region is formed. While phosphor is referred to as the ion to be implanted herein, it may also be arsenic. Further, the second amorphous silicon layer 104 may be formed previously as amorphous silicon containing phosphor or arsenic thereby saving the processing step.

The material of the buffer layer 134 is, for example, represented at an atom number ratio by the following general formula (1):

$$A_X B_Y \quad (1)$$

(in which X and Y each represents $0.2 \leq X \leq 0.7$, and $0.3 \leq Y \leq 0.8$, A represents Ge, and B represents Si), and the buffer layer is disposed for preventing thermal deformation and evaporation of the non-volatile recording material layer thereby enabling annealing of the non-volatile recording material layer and preventing diffusion of impurities to the non-volatile recording material layer or the diode. In addition to Ge and Si, other elements than alkali metal elements and halogen elements may be contained by 20 at % or less. It is preferred that Ge content is higher on the side of the recording material and the silicon content is higher on the side of the diode in the direction of the layer thickness since they give less undesired effects even when they are diffused to adjacent layers. When Ge in the average composition is excessively small, the laser light used for annealing transmits to the non-volatile recording material layer excessively to possibly damage the non-volatile recording material layer. On the other hand, when it is excessively large, the resistance is increased. Situations are reversed in the case of the average Si content in the direction of the layer thickness. Use of the buffer layer and the composition thereof are effective also to a memory matrix where the reflection layer of the invention is not present. The thickness of the layer is preferably 100 nm or more and 500 nm or less. When the layer thickness is excessively large, the driving voltage increases excessively. On the other hand, when the thickness is excessively small, the effect for protection or diffusion prevention is insufficient. Further, while the buffer layer material in Embodiment 2 can also be used, the constitution of the buffer layer in this embodiment is desired from a view point of the protection effect of the non-volatile recording material layer to the annealing.

The material of the non-volatile recording material layer 115 is $Ge_2Sb_2Te_5$ and has a layer thickness of 5 nm or more and 300 nm or less. More preferably, it has a layer thickness of 5 nm or more and 50 nm or less of lower aspect ratio so that dry etching and burying of the insulative material in the subsequent steps can be performed easily. While the material of the non-volatile recording material layer 115 has been described in this embodiment with the example of $Ge_2Sb_2Te_5$, a performance at an identical level can be obtained by selecting the composition from materials of known phase change memory and materials containing at least one element of chalcogen elements (O, S, Se, Te) which are materials of RRAM that store information by the change of resistance. The material of the second metal interconnect layer 116 is tungsten and, more preferably, aluminum or copper of lower resistivity.

Figure 28:
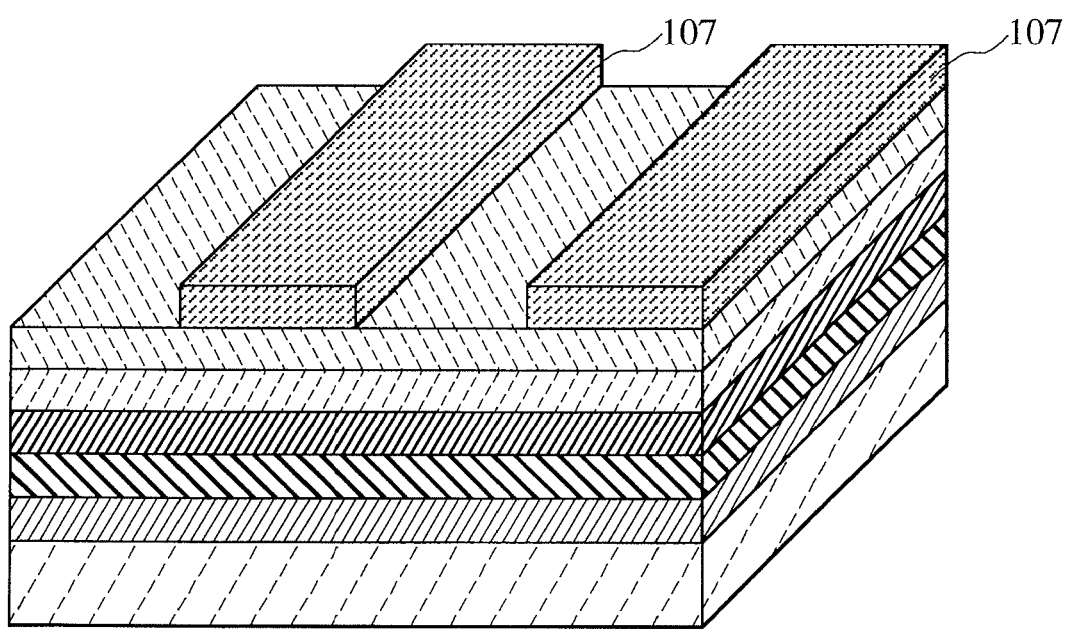
FIG. 28 is a perspective view of the semiconductor device during a manufacturing step succeeding to FIG. 27.

The material of the light reflection layer 105 is CdS and the layer thickness is defined such that the phase is substantially identical between a light reflected at the surface of the layer and a light reflected at the rear face and they are strengthened to each other, that is, the difference of the optical path between a light reflected at the surface and a light returning after reciprocation in the film is about an integer multiple of the wavelength. Assuming the wavelength of the laser used for the laser annealing as λ and the refractive index of the reflection layer to the wavelength as n, the layer thickness is preferably λ/2n. The layer thickness is 20 nm or more and 300 nm or less while it is different depending on the laser wavelength and the refractive index of the film. It is more preferably 50 nm or more and 250 nm or less. When the layer is excessively thin, the effect of anti-reflection is insufficient. On the other hand, when the layer thickness is excessively large, the driving voltage increases. FIG. 28 shows a structure after etching the light reflection layer 105 by a known dry etching technique in the structure shown in FIG. 27.

Figure 29:
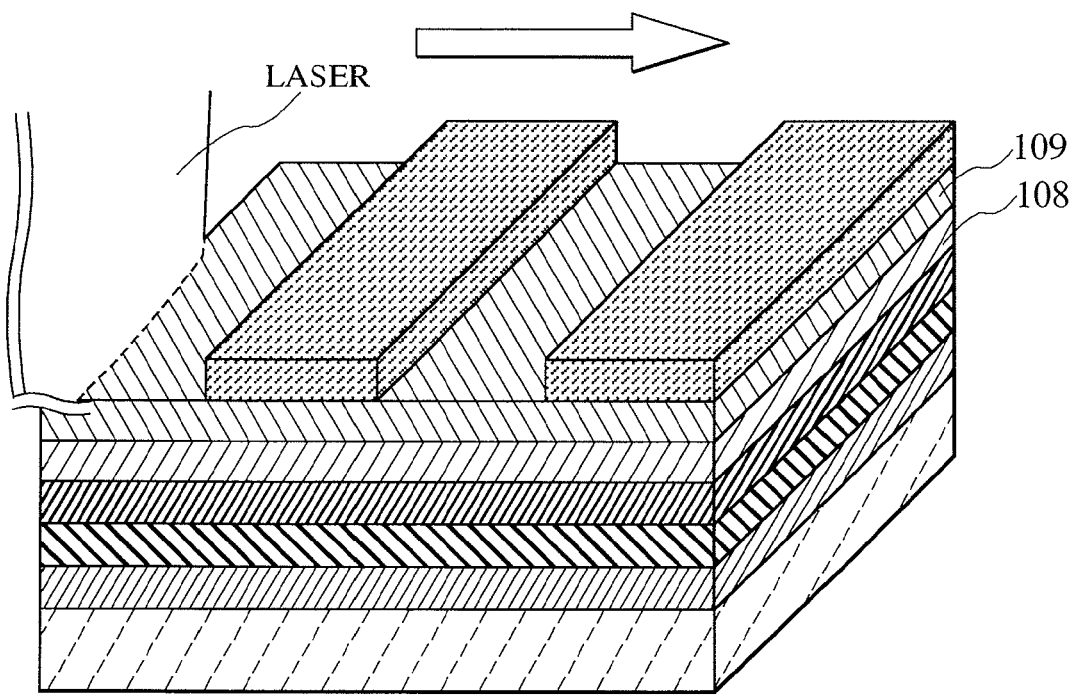
FIG. 29 is a perspective view of the semiconductor device during a manufacturing step succeeding to FIG. 28.

FIG. 29 shows a step of applying laser annealing to the surface of the structure shown in FIG. 29 for crystallizing and activating the first amorphous silicon layer 103 and the second amorphous silicon layer 104. In the annealing, as has been described above with reference to FIG. 2A to FIG. 2C, the temperature of the first amorphous silicon layer 103 and the second amorphous silicon layer 104 at a portion below the light reflection layer 107 is lower than the temperature of the first amorphous silicon layer 103 and the second amorphous silicon layer 104 at a portion where the light reflection layer 107 is not present thereabove since the laser is absorbed to or reflected at the light reflection layer 107. Accordingly, since crystallization starts from the portions of the first amorphous silicon layer 103 and the second amorphous silicon layer 104 below the light reflection layer 107, grain boundaries are formed at the portions of the first amorphous silicon layer 103 and the second amorphous silicon layer 104 where the light reflection layer 107 is not present thereabove and the yield of the selection device can be improved.

By performing crystallization and impurity activation for the first amorphous silicon layer 103 and the second amorphous silicon layer 104 by the laser annealing, the first polysilicon layer 108 and the second polysilicon layer 109 are formed. In this embodiment, the selection device constituting the memory cell is a pn diode. Accordingly, while the manufacturing method has been explained with the case of a selection device in which the junction between the first polysilicon layer 108 and the second polysilicon layer 109 is the pn junction, a selection device having other junction such as an np junction or a pin junction, or a Schottky junction with the first metal interconnect layer 102 may also be used for the memory cell.

Figure 30:
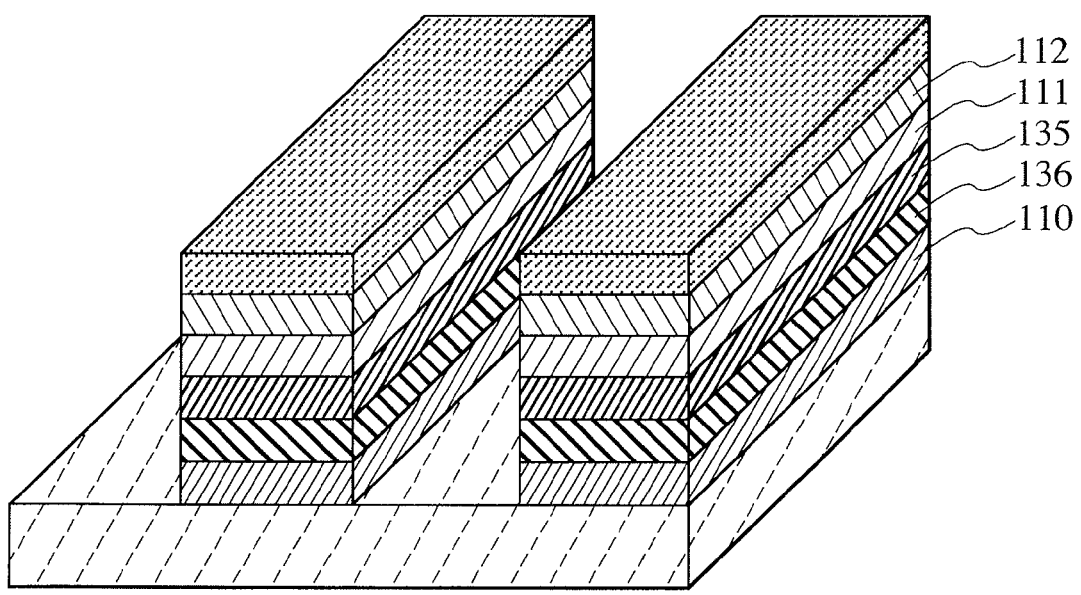
FIG. 30 is a perspective view of the semiconductor device during a manufacturing step succeeding to FIG. 29.

FIG. 30 shows a structure after processing the second polysilicon layer 109, the first polysilicon layer 108, the buffer layer 134, the non-volatile recording material layer 115, and the first metal interconnect layer 102 by a known dry etching technique using the light reflection layer 107 shown in FIG. 29 as a mask. The pattern of a stacked film comprising the first metal interconnect layer 110, the non-volatile recording material layer 136, the buffer layer 135, the first polysilicon layer 111, the second polysilicon layer 112, and the light reflection layer 107 is a pattern of the word line and formed so as to extend in parallel with an adjacent pattern above the memory matrix. Further, while the first metal interconnect layer 110 is electrically connected as the word line of the memory matrix with the semiconductor substrate 101 so that reading from and writing to the non-volatile memory can be performed, this is not illustrated in the drawing.

Figure 31:
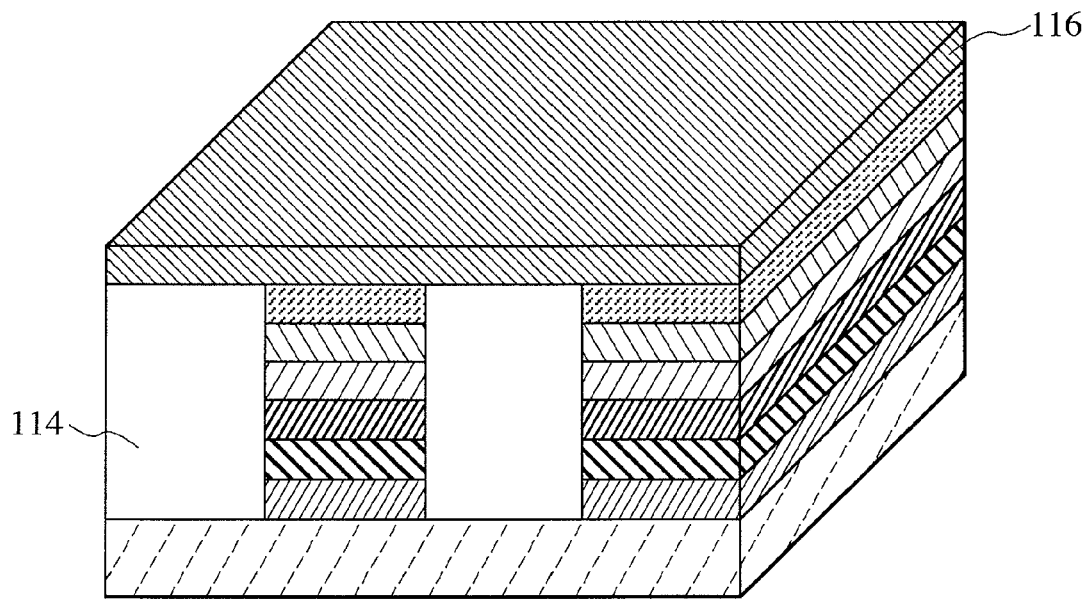
FIG. 31 is a perspective view of the semiconductor device during a manufacturing step succeeding to FIG. 30.

FIG. 31 shows a structure after filling an insulative material between the patterns above the structure shown in FIG. 30 by using HDP-CVD, planarizing the same by CMP, and then depositing a second metal interconnect layer 116 by sputtering.

Figure 32:
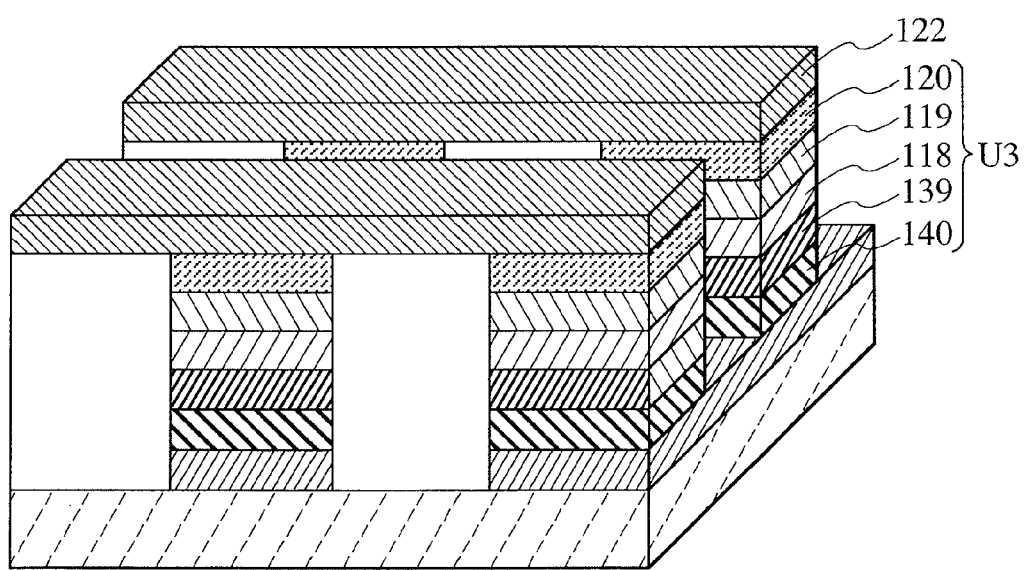
FIG. 32 is a perspective view of the semiconductor device during a manufacturing step succeeding to FIG. 31.

FIG. 32 shows a structure after processing the second metal interconnect layer 116, the light reflection layer 107, the second polysilicon layer 112, the first polysilicon layer 111, the buffer layer 135, and the non-volatile recoding material layer 136 by using known lithographic technique and dry etching technique above the structure shown in FIG. 31. A stacked film U3 comprising the non-volatile recording material layer 140, the buffer layer 139, the first polysilicon layer 118, the second polysilicon layer 119, and the light reflection layer 120 has a pillar shape. The pattern of the second metal interconnect layer 122 is a pattern of the bit line and formed so as to extend in parallel with the pattern of an adjacent bit line above the memory matrix. The pattern of the second metal interconnect layer 122 intersects the pattern of the first metal interconnect layer 110. Further, while the second metal interconnect layer 122 is electrically connected as the bit line of the memory matrix with the semiconductor substrate 101 so that reading from and writing to the non-volatile memory can be performed, this is not illustrated in the drawing.

Figure 33:
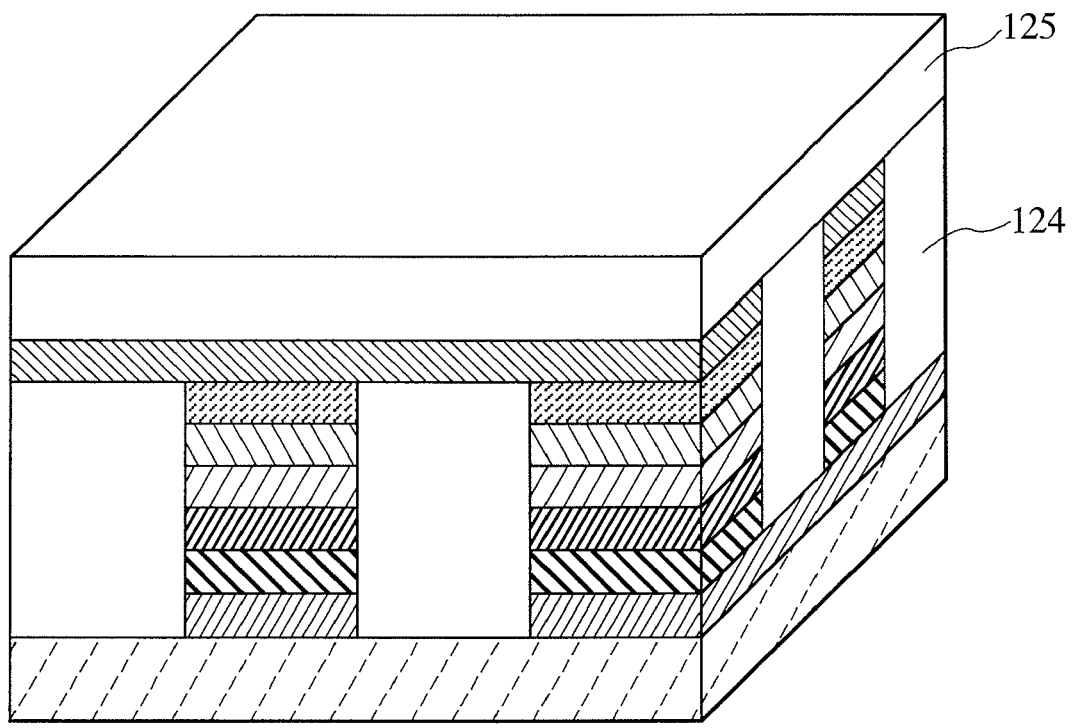
FIG. 33 is a perspective view of the semiconductor device during a manufacturing step succeeding to FIG. 32.

FIG. 33 shows a structure after filling an insulative material 124 between the patterns above the structure shown in FIG. 32 by using HDP-CVD, then planarizing the same by CMP and then depositing the insulative material 125.

Figure 34:
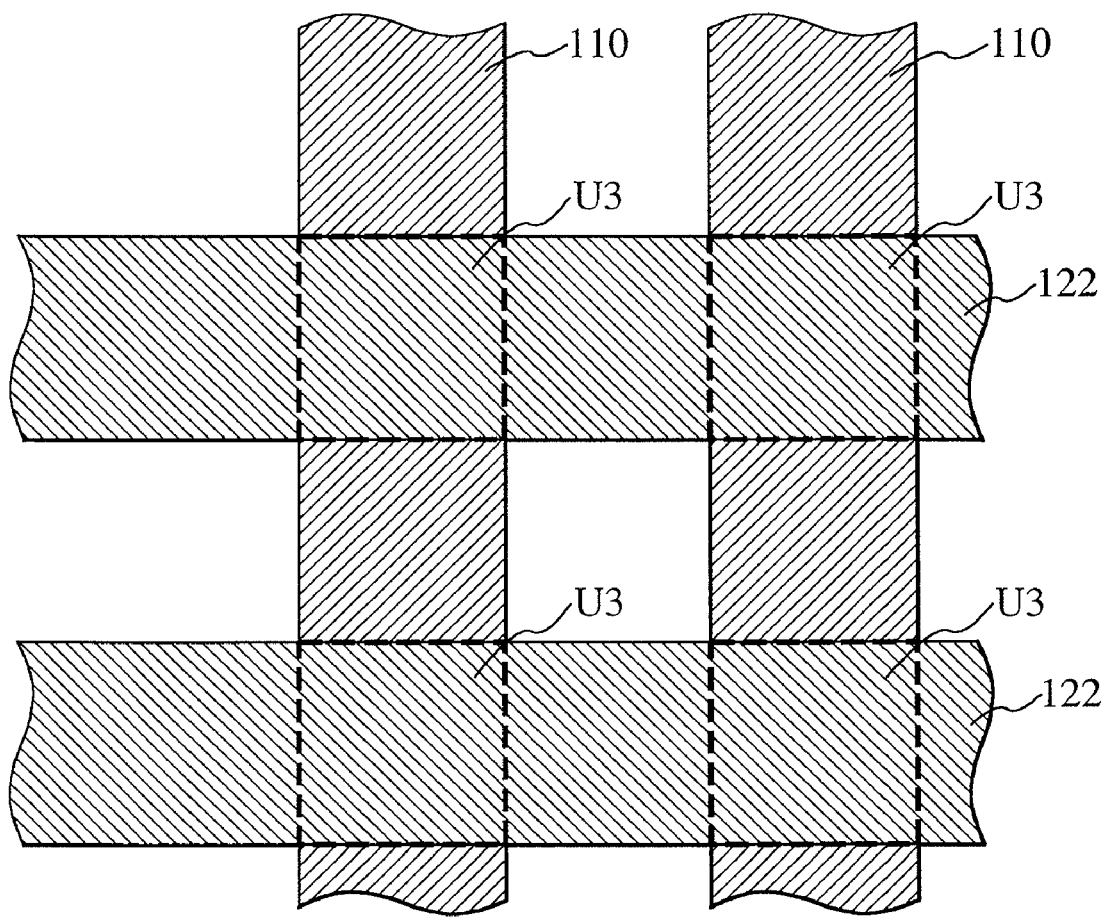
FIG. 34 is an upper plan view corresponding to the structure described in FIG. 33.
Figure 35:
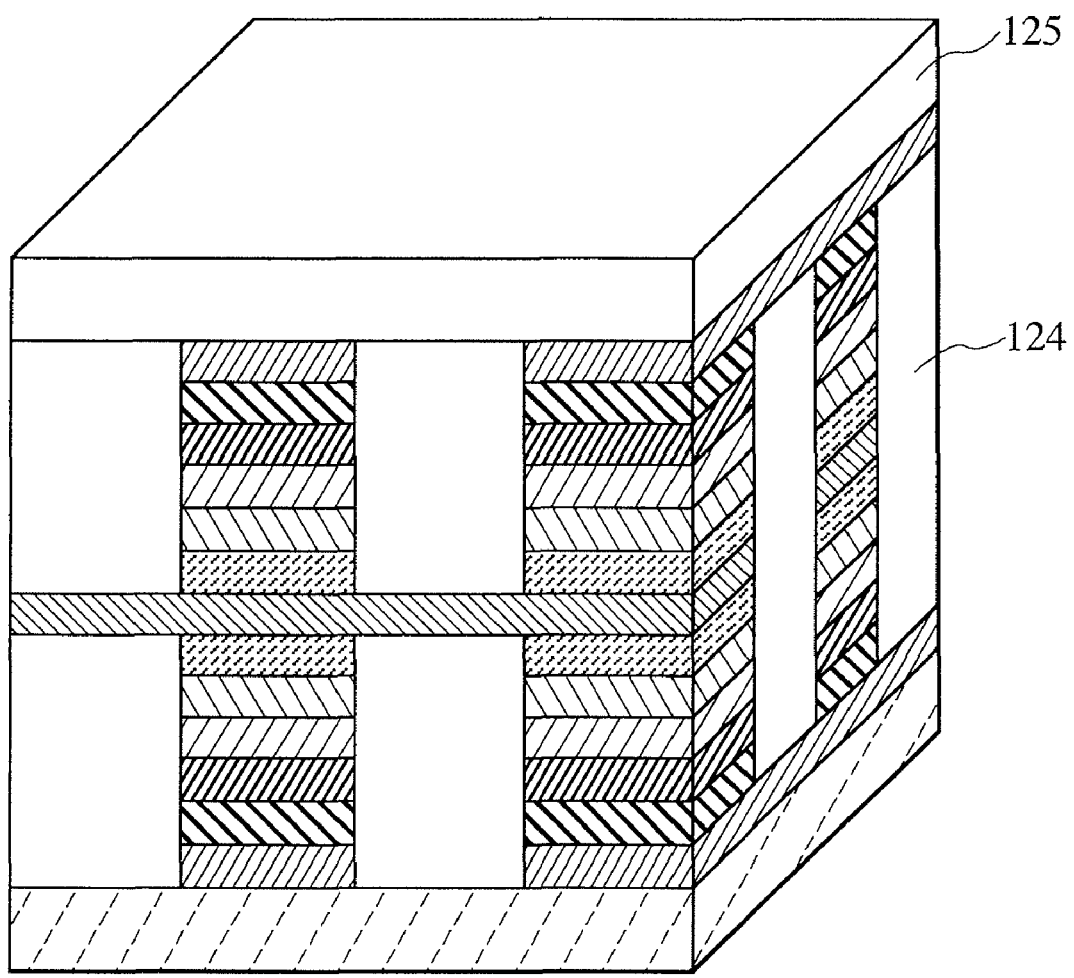
FIG. 35 is a perspective view of a semiconductor device according to Embodiment 3 of the invention during a manufacturing step.

FIG. 34 shows an upper plan view of a memory cell manufactured by a manufacturing method described with reference to FIG. 27 to FIG. 33. The first metal interconnect layer 110 which is the word line of the memory cell and the second metal interconnect layer 122 which is the bit line of the memory cell intersect each other, and the stacked film U3 is disposed at each intersection. Materials used for respective layers are identical with those of Embodiment 1. Further, the plurality of layers of memory matrix may be stacked like in Embodiment 1. In this case, the second layer is preferably disposed in a reversed stacking order such that the word line can be used in common as shown in FIG. 35, since the production cost is further lowered.

The material and the thickness of the reflection layer are identical with those of Embodiment 1.

The operation method of the memory matrix to which the memory cell of the non-volatile memory of this embodiment is applied is identical with that of Embodiment 1.

Embodiment 4

In Embodiment 1, description has been made to a manufacturing method of disposing a light reflection layer above the word line pattern thereby controlling the crystal grain boundary. However, the light reflection layer does not necessarily have a stripe-like shape as the word line pattern described with reference to FIG. 2A to FIG. 2C as the first method of the invention so long as the light reflection layer is disposed above a region where the diode is formed upon completion of the memory cell.

Figure 36:
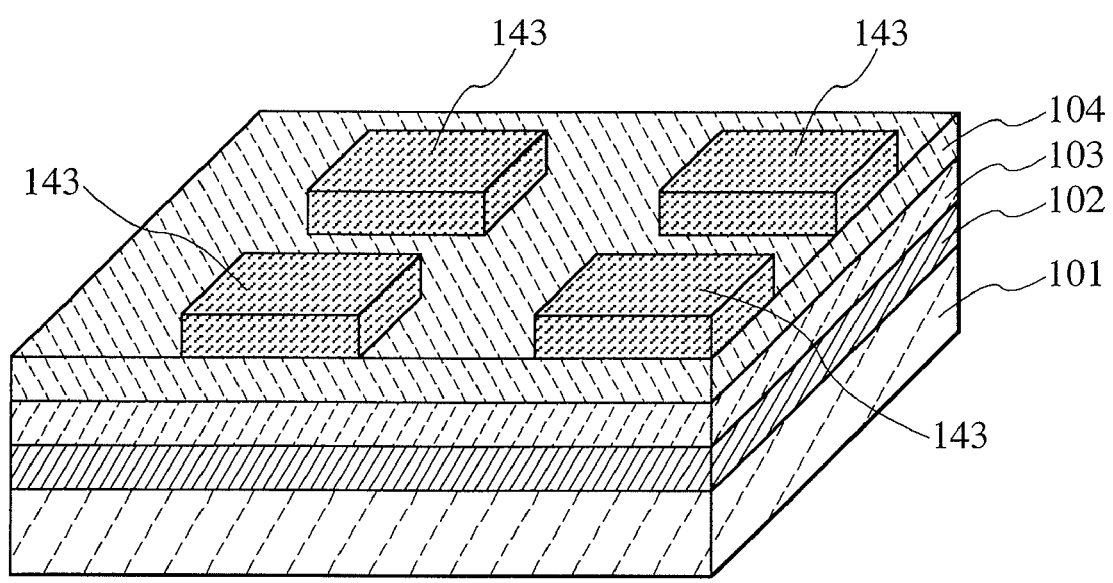
FIG. 36 is a perspective view of a semiconductor device according to Embodiment 4 of the invention during a manufacturing step.
Figure 37:
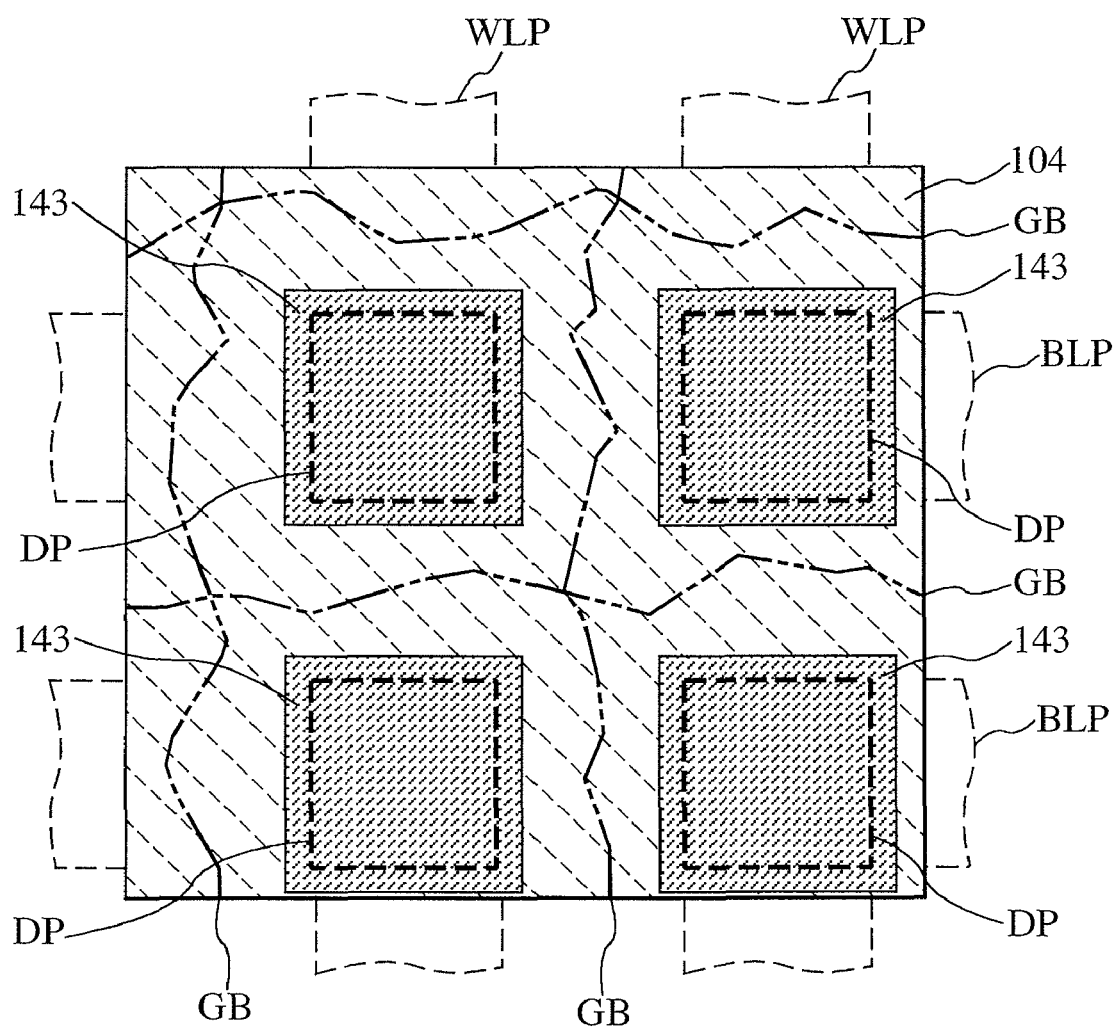
FIG. 37 is an upper plan view corresponding to the structure described in FIG. 36.

For example, in a case where the diode is formed as the selection device of the non-volatile memory explained in Embodiment 1, the light reflection layer may be disposed also on a dot form at the intersection between the word line pattern and the bit line pattern. FIG. 36 shows a structure after depositing, above a semiconductor substrate 101, the first metal interconnect layer 102, the first amorphous silicon layer 103, the second amorphous silicon layer 104, and the light reflection layer successively, and processing the light reflection layer such that the light reflection layer is disposed on the pattern DP forming the diode. FIG. 37 is a view showing a relative position between the pattern DP forming the diode and the light reflection layer 143. When laser annealing is applied to the structure, crystal grain boundaries GB are formed as shown in FIG. 37. In Embodiment 1, the upper surface area of the reflection layer is an upper surface area of the word line pattern WLP and this is larger than the upper surface area of the reflection layer of this embodiment since this is in the stripe form. Since distortion generated in the silicon layer increases upon crystallization when the area of the reflection layer is large, that is, the area of the silicon layer providing the temperature profile by the laser annealing is large, grain boundaries GB may be possibly formed at a portion where the diode is formed, which increases the variation of the diode property. On the other hand, when the area of the reflection layer is small, the effect is mitigated relatively. That is, when the light reflection layer is disposed in the dot form as shown in FIG. 37, grain boundaries GB are not formed relatively at a portion where the diode is formed compared with that of Embodiment 1 and the variation of the diode property also decreases. Accordingly, this embodiment having a smaller area of the reflection layer can manufacture the diode at a higher yield than Embodiment 1. After laser annealing, the light reflection layer is removed by using a known etching technique to manufacture a non-volatile memory in the same manner as in Embodiment 2 explained with reference to FIG. 21 to FIG. 25.

The material and the layer thickness of the reflection layer are identical with those of Embodiment 1.

Embodiment 5

Figure 38A:
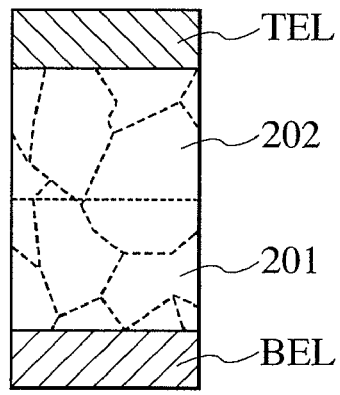
FIGS. 38A, 38B, and 38C are circuit diagrams each of a main portion of a memory matrix of a semiconductor device of the invention as Embodiment 5 according to the invention.
Figure 38B:
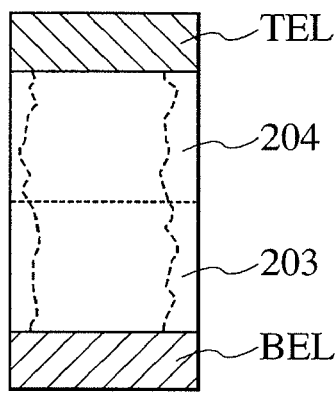
Figure 38C:
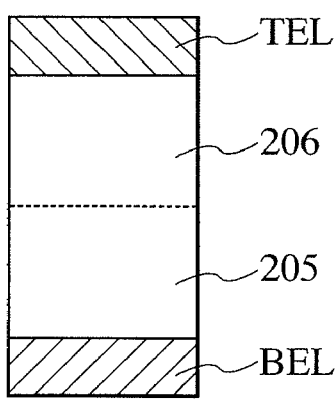
Figure 39:
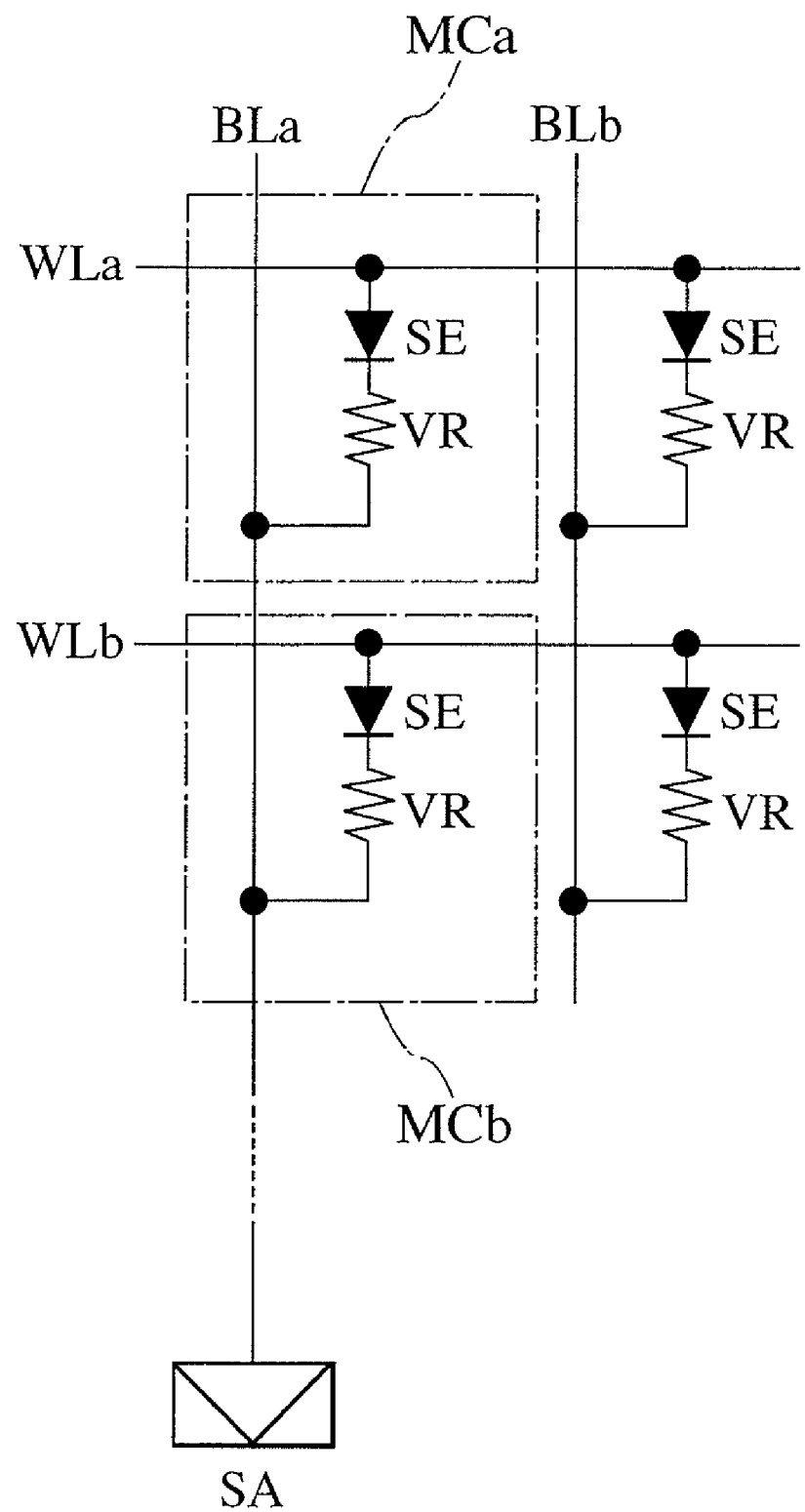
FIG. 39 is a circuit diagram of a main portion of a memory matrix of a semiconductor device.

In this case, description is to be made for crystal grain boundaries of polysilicon in the vertical cross section of the selection devices formed by Embodiments 1 to 4. FIG. 38A shows the cross section of a selection device portion of a memory cell formed by an existent manufacturing method, and FIGS. 38B and 38C show the cross section of the selection device portion of the memory cell formed by the manufacturing method of the invention. In FIG. 38, 201 and 202, 203 and 204, and 205 and 206 constitute sets of pn junction diodes respectively, and TEL and BEL schematically describe electrodes for applying a voltage to the diodes. Further, each of the diodes may have a pin junction but the explanation thereof is omitted in this embodiment. Further, the thickness of each pn junction diode is 20 nm or more and 500 nm or less.

In the existent manufacturing method, as shown in FIG. 38A, crystal grain boundaries in the first polysilicon layer 201 and the second polysilicon layer 202 are arranged at random relative to the lower electrode BEL and the upper electrode TEL.

On the other hand, in the manufacturing method of the invention, as shown in FIG. 38B, crystal grain boundaries are arranged so as to connect BEL and TEL in a linear manner by controlling the reflection layer or laser power profile. In other words, a grain boundary connecting BEL and TEL comprises a single line and a branching point is not present in each of the lines. While it is preferred that the single line is not present at all as shown in FIG. 38C since the off leak current is decreased, one or two number of the single line may be disposed as shown in FIG. 38B, or more. As described above, the structural feature of the polysilicon diode layer in this embodiment resides in a structure where the grain boundaries are not present at all or the grain boundary connecting the electrodes consists of a single line and no branching point are present in a vertical cross section. They may be present in admixture in different memory cells in one direction. Such a structure can provide a memory device using a favorable polysilicon diode with less off leak compared with an existent selection device.

While the present invention has been described above with reference to preferred embodiments 1 to 5, the invention is not restricted to each of the embodiments but various other embodiments may be considered so long as they do not depart from the technical idea of the invention. For example, the same effect as the invention can be obtained also by using light reflection layers in combination of Embodiments 1 and 2 and adopting a step of modulating the laser power.

What is claimed is:

1. A method of manufacturing a non-volatile memory device including a memory device for storing information by a change of a resistance value of a memory material layer, the memory device having a structure of combination of the memory material layer and a diode, the method comprising:
    providing a substrate;
    forming a lower electrode above the substrate;
    forming a first amorphous silicon layer above the lower electrode;
    forming a second amorphous silicon layer above the first amorphous silicon layer;
    irradiating a surface of the second amorphous silicon layer with a laser so as to transform at least the second amorphous silicon layer into a polysilicon layer; and
    patterning the polysilicon layer,
    wherein the laser irradiates in the step of laser irradiation so as to form a first region of a higher temperature and a second region of a relatively lower temperature temporarily in a horizontal direction in the second amorphous silicon layer, and
    wherein, in the step of patterning the polysilicon layer, a portion of the polysilicon layer associated with the first region is removed.

2. The manufacturing method of a non-volatile memory device according to claim 1, further including:
    forming a light reflection layer above the second amorphous silicon; and
    patterning the light reflection layer,
    wherein, in the step of laser irradiation, the patterned light reflection layer is irradiated by the laser.

3. The manufacturing method of a non-volatile memory device according to claim 2, wherein the light reflection layer comprises a metal or an alloy containing 70 at % or more of W, Mo or Al, or a material of a compositional ratio of an atom number ratio represented by the following general formula (1):

$$A_x B_y \tag{1}$$

(in which X and Y satisfy $0.3 \leq X \leq 0.7$ and $0.3 \leq Y \leq 0.7$, respectively, A is at least one element selected from the group consisting of Zn, Cd, Ga, In, Si, Ge, Sn, Ti, Zr, and Hf, and B is at least one element selected from the group consisting of N and O).

4. The manufacturing method of a non-volatile memory device according to claim 2, wherein, in the step of patterning the polysilicon layer, the patterning is performed using the patterned light reflection layer as a mask.

5. The manufacturing method of a non-volatile memory device according to claim 1, wherein the power of the laser irradiation is lowered relatively at the second region in the step of laser irradiation.

6. The manufacturing method of a non-volatile memory device according to claim 1, wherein the memory material layer is a phase change memory material layer.

7. The manufacturing method of a non-volatile memory device according to claim 1, further including forming the memory material layer before forming the first and the second amorphous silicon layers.

8. The manufacturing method of a non-volatile memory device according to claim 1, further including forming the memory material layer after forming the first and second amorphous silicon layers.

9. The manufacturing method of a non-volatile memory device according to claim 1, wherein the first and the second amorphous silicon layers each have a layer thickness of 10 nm or more and 250 nm or less.

* * * * *